US011824098B2

(12) United States Patent
An et al.

(10) Patent No.: US 11,824,098 B2
(45) Date of Patent: Nov. 21, 2023

(54) SEMICONDUCTOR DEVICE AND METHOD OF FABRICATING THE SAME

(71) Applicant: Samsung Electronics Co., Ltd., Suwon-si (KR)

(72) Inventors: Ho Kyun An, Seoul (KR); Su Min Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/822,594

(22) Filed: Aug. 26, 2022

(65) Prior Publication Data

US 2022/0416038 A1 Dec. 29, 2022

Related U.S. Application Data

(63) Continuation of application No. 17/335,455, filed on Jun. 1, 2021, now Pat. No. 11,456,366.

(30) Foreign Application Priority Data

Oct. 12, 2020 (KR) .......................... 10-2020-0130911

(51) Int. Cl.
| | |
|---|---|
| *H01L 29/423* | (2006.01) |
| *H01L 27/092* | (2006.01) |
| *H01L 29/161* | (2006.01) |
| *H01L 29/40* | (2006.01) |
| *H01L 21/02* | (2006.01) |
| *H10B 12/00* | (2023.01) |

(52) U.S. Cl.
CPC .... *H01L 29/4236* (2013.01); *H01L 21/02532* (2013.01); *H01L 21/02667* (2013.01); *H01L 27/092* (2013.01); *H01L 29/161* (2013.01); *H01L 29/401* (2013.01); *H10B 12/50* (2023.02)

(58) Field of Classification Search
CPC . H01L 29/161; H01L 29/4236; H01L 27/092; H01L 21/02532; H01L 21/02667; H10B 12/50
USPC ........................................................ 257/369
See application file for complete search history.

(56) References Cited

U.S. PATENT DOCUMENTS

| | | |
|---|---|---|
| 8,039,892 B2 | 10/2011 | Foerster |
| 8,957,476 B2 | 2/2015 | Glass et al. |
| 9,275,907 B2 | 3/2016 | Chan et al. |
| 9,583,626 B2 | 2/2017 | Cheng et al. |
| 9,647,086 B2 | 5/2017 | Bentley et al. |
| 10,043,893 B1 | 8/2018 | Mulfinger et al. |

(Continued)

*Primary Examiner* — Monica D Harrison
(74) *Attorney, Agent, or Firm* — Myers Bigel, P.A.

(57) ABSTRACT

A semiconductor device includes a substrate including a first region and a second region, a first silicon-germanium film which is conformally formed inside a surface of the substrate of the first region and defines a first gate trench, a first gate insulating film which extends on the first silicon-germanium film along a profile of the first gate trench and is in physical contact with the first silicon-germanium film, a first metallic gate electrode on the first gate insulating film, a source/drain region formed inside the substrate on both sides of the first metallic gate electrode, a second gate insulating film in the second region and a second metallic gate electrode on the second gate insulating film.

20 Claims, 27 Drawing Sheets

(56) References Cited

U.S. PATENT DOCUMENTS

| | | |
|---|---|---|
| 10,236,344 B2 | 3/2019 | Alptekin et al. |
| 2014/0367774 A1 | 12/2014 | Yoo et al. |
| 2016/0093620 A1* | 3/2016 | Kim .................. H01L 27/0922 |
| | | 257/369 |

* cited by examiner

SEMICONDUCTOR DEVICE AND METHOD OF FABRICATING THE SAME

CROSS-REFERENCE TO RELATED APPLICATION

This application is a continuation of U.S. patent application Ser. No. 17/335,455, filed Jun. 1, 2021, which claims the benefit of Korean Patent Application No. 10-2020-0130911, filed Oct. 12, 2020 in the Korean Intellectual Property Office, the disclosures of which are hereby incorporated herein by reference.

BACKGROUND

1. Field of the Disclosure

The present disclosure relates to a semiconductor device and a method of fabricating the same.

2. Description of the Related Art

As a feature size of a MOS transistor decreases, a gate length and a length of a channel formed beneath may also decrease. Therefore, research has been conducted to increase capacitance between the gate and the channel and to improve the operating characteristics of the MOS transistor.

Silicon oxide films, which are mainly used as gate insulating films, may reach physical limits in their electrical properties with a decrease in thickness. Therefore, to replace the conventional silicon oxide film, research has been conducted on a high dielectric film having a high dielectric constant. The high dielectric film may reduce the leakage current between the gate electrode and the channel region, while maintaining a thin thickness of an equivalent oxide film.

SUMMARY

Aspects of the present disclosure provide a semiconductor device capable of improving the performance and reliability of the element.

Aspects of the present disclosure also provide a method of fabricating a semiconductor device capable of improving the performance and reliability of the element.

However, aspects of the present disclosure are not restricted to the ones set forth herein. The above and other aspects of the present disclosure will become more apparent to one of ordinary skill in the art to which the present disclosure pertains by referencing the detailed description of the present inventive concepts given below.

According to an aspect of the present disclosure, there is provided a semiconductor device comprising, a substrate including a first region and a second region, a first silicon-germanium film which is conformally formed inside a surface of the substrate of the first region and defines a first gate trench, a first gate insulating film, which extends on the first silicon-germanium film along a profile of the first gate trench, and is in physical contact with the first silicon-germanium film, a first metallic gate electrode on the first gate insulating film, a source/drain region formed inside the substrate on both sides of the first metallic gate electrode, a second gate insulating film in the second region and a second metallic gate electrode on the second gate insulating film.

According to another aspect of the present disclosure, there is provided a semiconductor device comprising, a silicon-germanium film, which is formed inside the substrate, and defines a gate trench, a gate insulating film extending along a profile of the gate trench on the silicon-germanium film, a gate electrode stack in the gate trench and on the gate insulating film, and a source/drain region formed inside the substrate on both sides of the gate electrode stack, wherein a germanium fraction of the silicon-germanium film decreases with increasing distance from the gate insulating film, wherein the silicon-germanium film extends along an upper surface of the substrate, and wherein a part of the source/drain region is in the silicon-germanium film.

According to another aspect of the present disclosure, there is provided a semiconductor device comprising, a substrate which includes a cell region and a peri-region defined around the cell region, a bit line structure, which includes a cell conductive line and a cell line capping film on the cell conductive line, on the substrate in the cell region, a cell gate electrode, which is inside the substrate in the cell region and intersects the cell conductive line, a silicon-germanium film, which is conformally formed inside the substrate in the peri-region and defines a gate trench, a gate insulating film extending along a profile of the gate trench on the silicon-germanium film, and a gate electrode stack in the gate trench and on the gate insulating film, wherein the gate electrode stack includes a lower metallic gate electrode, and an upper gate electrode on the lower metallic gate electrode, and wherein the upper gate electrode has a stack structure identical to the cell conductive line.

According to another aspect of the present disclosure, there is provided a method of fabricating a semiconductor device, the method comprising, forming a germanium feed film on a silicon substrate, forming a blocking film on the germanium feed film, after forming the blocking film, diffusing germanium in the germanium feed film into the silicon substrate through a first heat treatment process to form a pre silicon-germanium film, recrystallizing the pre silicon-germanium film through a second heat treatment process to form a silicon-germanium film and forming a gate insulating film on the silicon-germanium film.

BRIEF EXPLANATION OF THE DRAWINGS

The above and other aspects and features of the present disclosure will become more apparent by describing in detail exemplary embodiments thereof referring to the attached drawings, in which.

DETAILED DESCRIPTION

Figure 1:
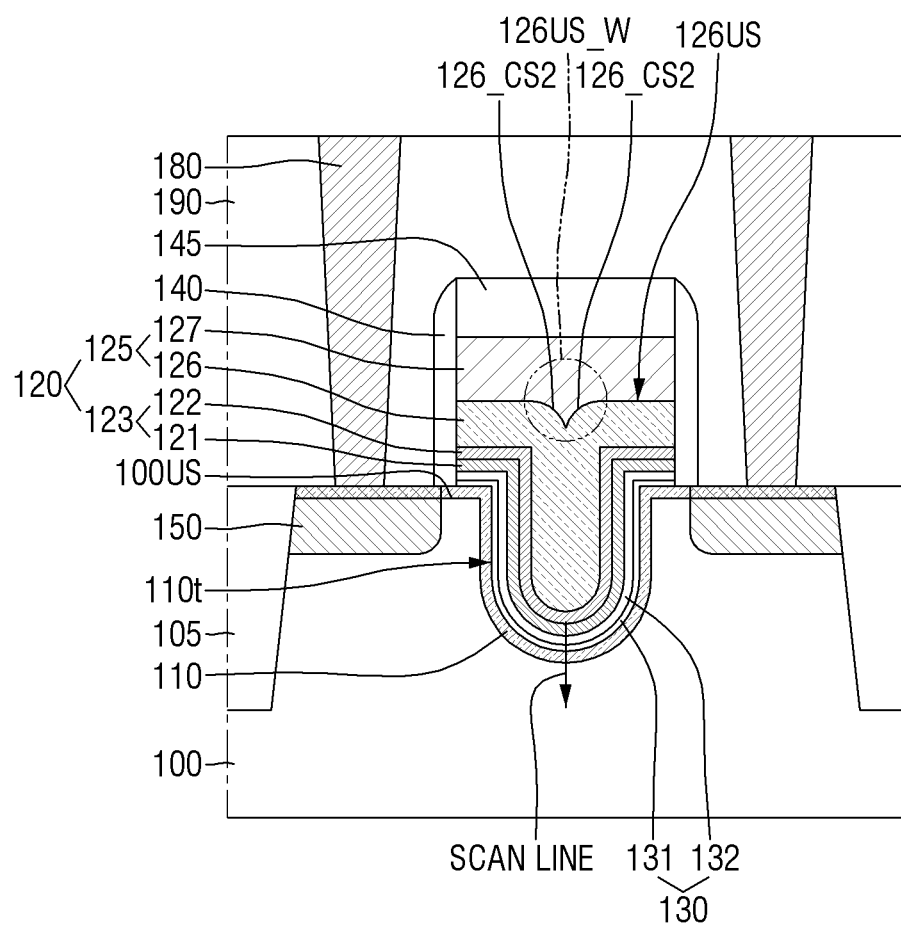
FIG. 1 is a diagram that illustrates a semiconductor device according to some embodiments of the inventive concept.

Hereinafter, embodiments of the present inventive concept will be described as follows with reference to the accompanying drawings in which example embodiments of the inventive concept are shown. The same reference numerals are used for the same elements in the drawings, and redundant descriptions thereof will be omitted. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 2A:
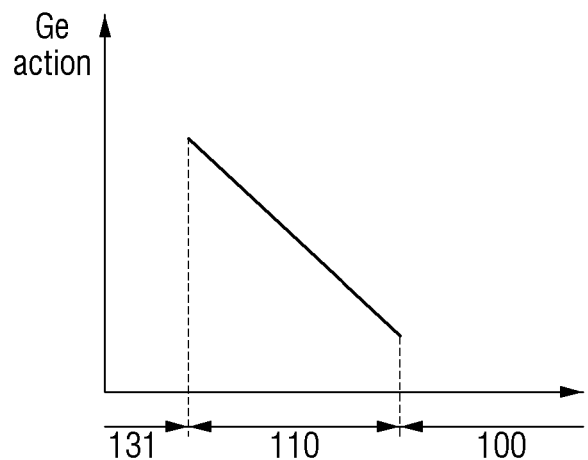
FIGS. 2A and 2B are diagrams schematically showing a fraction of germanium (Ge) along a SCAN LINE of FIG. 1, respectively.
Figure 2B:
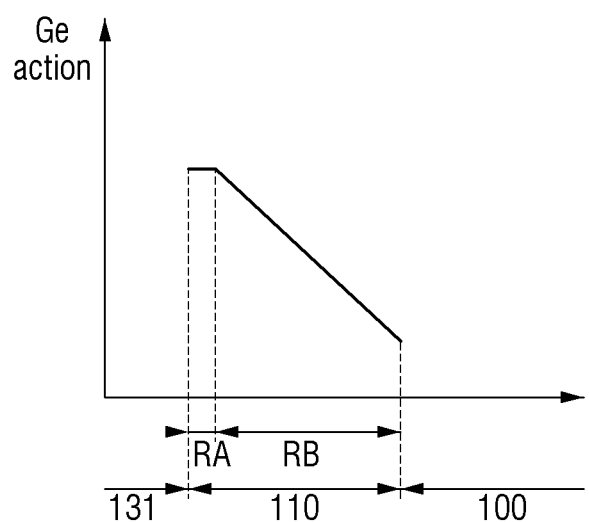

FIG. 1 is a diagram that illustrates a semiconductor device according to some embodiments of the inventive concept. FIGS. 2A and 2B are diagrams schematically showing a fraction of germanium (Ge) along a SCAN LINE of FIG. 1, respectively.

Referring to FIGS. 1 to 2B, the semiconductor device, according to some embodiments, may include a substrate 100, a first silicon-germanium film 110, a first gate electrode stack 120, a first gate insulating film 130 and a first source/drain region 150.

The substrate 100 may be a silicon substrate or an SOI (silicon-on-insulator). In other embodiments, the substrate 100 may include, but is not limited to, silicon germanium, SGOI (silicon germanium on insulator), indium antimonide, lead tellurium compounds, indium arsenic, indium phosphide, gallium arsenide and/or gallium antimonide.

In the semiconductor device according to some embodiments, the substrate 100 may be a silicon substrate. In other embodiments, the substrate 100 may have a composition in which a silicon substrate and a base substrate made of another material are bonded to each other. The base substrate may be, but is not limited to, a substrate made up of a compound semiconductor as described above. When the substrate 100 is in the bonded form of the silicon substrate and the base substrate, a first silicon-germanium film 110 may be formed inside the silicon substrate as will be described below.

A first element isolation film 105 may be placed inside the substrate 100. The first element isolation film 105 may define an active region. The first element isolation film 105 may be formed as a shallow trench isolation (STI) structure. The first element isolation film 105 may extend from an upper side 100US of the substrate in a thickness direction (for example, D4 of FIG. 12) of the substrate 100. The thickness direction of the substrate 100 may be perpendicular to the upper side or surface 100US of the substrate. The first element isolation film 105 may include, for example, silicon oxide, silicon nitride, silicon oxynitride, and combinations thereof.

The first silicon-germanium film 110 may be formed inside a surface the substrate 100. The first silicon-germanium film 110 may be formed conformally inside the surface the substrate 100.

For example, the first silicon-germanium film 110 may include a first portion placed on the upper side or surface 100US of the substrate, and a second portion placed at a position lower than the upper side or surface 100US of the substrate in the cross-sectional view of FIG. 1. Here, the upper side or surface of the substrate 100US is a boundary line between the substrate 100 and the first portion of the first silicon-germanium film 110.

The first silicon-germanium film 110 may define a first gate trench 110t. The first gate trench 110t may be defined by a first silicon-germanium film 110 placed at a position lower than the upper side or surface 100US of the substrate in the cross-sectional view of FIG. 1. That is, the first gate trench 110t may be defined by the second portion of the first silicon-germanium film 110.

The first gate trench 110t may extend from the upper side or surface 100US of the substrate into the substrate 100. The first gate trench 110t may extend from the upper side or surface 100US of the substrate in the thickness direction of the substrate 100.

In the semiconductor device according to some embodiments, the expression "film is formed conformally" may mean that a film having a generally uniform thickness is formed. The first silicon-germanium film 110 may be formed inside the surface of the substrate 100 with a generally uniform thickness. For example, in the portion of the first silicon-germanium film 110 that defines the first gate trench 110t, the ratio of a minimum value of the thickness of the first silicon-germanium film 110 to a maximum value of the thickness of the first silicon-germanium film 110 may be 90% or more.

The first silicon-germanium film 110 may be formed of a silicon germanium film. For example, the first silicon-germanium film 110 may include a single crystal silicon germanium film. As an example, the first silicon-germanium film 110 may include doped p-type impurities and/or n-type impurities. As another example, the first silicon-germanium film 110 may be formed of an undoped silicon germanium film. Here, the term "undoped" does not mean that impurities are not included, but means that intentionally doped impurities are not included. That is, the undoped silicon germanium film may or may not include impurities.

The first gate insulating film 130 may be placed on the first silicon-germanium film 110. The first gate insulating film 130 may be in physical contact with the first silicon-germanium film 110.

The first gate insulating film 130 may extend along the profile of the first gate trench 110t. The first gate insulating film 130 may extend along the profile of the first silicon-germanium film 110.

As an example, the first gate insulating film 130 may include a portion extending along the upper side or surface 100US of the substrate. As another example, unlike the shown example, the first gate insulating film 130 does not include a portion extending along the upper side or surface 100US of the substrate.

The first gate insulating film 130 includes a first interfacial film 131 and a first high dielectric constant insulating film 132 which are sequentially placed on the first silicon-germanium film 110. The first interfacial film 131 may be placed between the first silicon-germanium film 110 and the first high dielectric constant insulating film 132. The first interfacial film 131 may be in direct physical contact with the first silicon-germanium film 110. The first interfacial film 131 may include, for example, a silicon oxide film.

The first high dielectric constant insulating film 132 may include, for example, a high dielectric constant material having a higher dielectric constant than silicon oxide. The high dielectric constant material may include, for example, one or more of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and/or lead zinc niobate.

In FIGS. 2A and 2B, a germanium fraction of the first silicon-germanium film 110 may change, with increasing distance from the first gate insulating film 130. For example, the germanium fraction of the first silicon-germanium film 110 decreases, with increasing distance from the first gate insulating film 130.

Although the germanium fraction in the first interfacial film 131 and the germanium fraction in the substrate 100 are shown as 0, they are only for convenience of description, and the embodiments are not limited thereto. That is, the first interfacial film 131 and/or the substrate 100 may include germanium diffused from the first silicon-germanium film 110.

As an example, at a boundary between the first silicon-germanium film 110 and the substrate 100, the germanium fraction of the first silicon-germanium film 110 is greater than zero. As another example, unlike the shown example, the germanium fraction of the first silicon-germanium film 110 may be 0 at the boundary between the first silicon-germanium film 110 and the substrate 100.

In FIG. 2A, the germanium fraction of the first silicon-germanium film 110 may continuously decrease with increasing distance from the first interfacial film 131. Although the germanium fraction of the first silicon-germanium film 110 decreases linearly, this is only for convenience of explanation, and the embodiments are not limited thereto.

In FIG. 2B, the first silicon-germanium film 110 may include a first portion RA and a second portion RB. The germanium fraction may be constant inside the first portion RA of the first silicon-germanium film 110. The germanium fraction may continuously decrease inside the second portion RB of the first silicon-germanium film 110. The first portion RA of the first silicon-germanium film 110 may be closer to the first interfacial film 131 than the second portion RB of the first silicon-germanium film 110. For example, the first interfacial film 131 may be formed by oxidizing a silicon germanium film. At this time, germanium of the first silicon-germanium film 110 may move in the direction of the substrate 100, while the first interfacial film 131 is being formed. That is, while the first interfacial film 131 is being formed, a generally constant germanium concentration may occur in the first portion of the silicon-germanium film 110 that forms a boundary with the first interfacial film 131. Accordingly, the germanium fraction may be constant inside the first portion RA of the first silicon-germanium film 110.

The semiconductor device according to some embodiments may include an NC (Negative Capacitance) FET using a negative capacitor. For example, the first high dielectric constant insulating film 132 may include a ferroelectric material film having a ferroelectric property, and a paraelectric material film having a paraelectric property.

The ferroelectric material film may have a negative capacitance, and the paraelectric material film may have a positive capacitance. For example, if two or more capacitors are connected in series and the capacitance of each capacitor has a positive value, the total capacitance is less than the capacitance of each individual capacitor. On the other hand, if at least one of the capacitances of the serially connected capacitors has a negative value, the overall capacitance may be greater than an absolute value of each individual capacitance, while having a positive value. When the ferroelectric material film having the negative capacitance and the paraelectric material film having the positive capacitance are connected in series, the overall capacitance values of the ferroelectric material film and the paraelectric material film connected in series may increase. Taking advantage of the increased overall capacitance value, a transistor including the ferroelectric material film may have a subthreshold swing (SS) less than 60 mV/decade at room temperature.

The ferroelectric material film may have the ferroelectric properties. The ferroelectric material film may include at least one of hafnium oxide, hafnium zirconium oxide, barium strontium titanium oxide, barium titanium oxide and/or lead zirconium titanium oxide. Here, as an example, hafnium zirconium oxide may be a material obtained by doping the hafnium oxide with zirconium (Zr). As another example, the hafnium zirconium oxide may also be a compound of hafnium (Hf), zirconium (Zr) and/or oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and/or tin (Sn). The kind of dopant included in the ferroelectric material film may differ, depending on the kind of ferroelectric material included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al) and/or yttrium (Y).

When the dopant is aluminum (Al), the ferroelectric material film may include 3 to 8 at % (atomic %) aluminum. Here, the ratio of the dopant may be the ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have the paraelectric property. The paraelectric material film may include, for example, at least one of silicon oxide and/or a metal oxide having a high dielectric constant. The metal oxide included in the paraelectric material film may include, for example, but is not limited to, at least one of hafnium oxide, zirconium oxide and/or aluminum oxide.

The ferroelectric material film and the paraelectric material film may include the same material. Although the ferroelectric material film has the ferroelectric properties, the paraelectric material film may not have the ferroelectric properties. For example, when the ferroelectric material film and the paraelectric material film include hafnium oxide, the crystal structure of the hafnium oxide included in the ferroelectric material film is different from the crystal structure of the hafnium oxide included in the paraelectric material film.

The ferroelectric material film may have a thickness with ferroelectric properties. The thickness of the ferroelectric material film may be, for example, but is not limited to, 0.5 to 10 nm. Since a critical thickness that exhibits the ferroelectric properties may differ for each ferroelectric material, the thickness of the ferroelectric material film may vary depending on the ferroelectric material. As an example, the first gate insulating film 130 may include a single ferroelectric material film. As another example, the first gate insulating film 130 may include a plurality of ferroelectric material films spaced apart from each other. The first gate insulating film 130 may include a stacked film structure in which the plurality of ferroelectric material films and the plurality of paraelectric material films are alternately stacked.

The first gate electrode stack 120 may be placed on the first gate insulating film 130. The first gate electrode stack 120 may fill or at least partially fill the first gate trench 110t.

As an example, the first gate electrode stack 120 may include a portion that covers or is on the upper side or surface 100US of the substrate. As another example, unlike the shown example, the first gate electrode stack 120 does not include a portion that covers the upper side or surface 100US of the substrate.

Although a single first gate electrode stack 120 is shown as being placed between the adjacent first element isolation films 105, this is only for convenience of description, and the embodiments are not limited thereto.

The first gate electrode stack 120 may include a first lower gate electrode 123 and a first upper gate electrode 125.

The first lower gate electrode 123 may be placed on the first gate insulating film 130. The first lower gate electrode 123 may extend along the profile of the first gate insulating film 130. For example, the first lower gate electrode 123 may fill or at least partially fill a part of the first gate trench 110t in which the first gate insulating film 130 is formed.

The first lower gate electrode 123 may be, for example, a metallic gate electrode including a metallic conductive material. That is, the first lower gate electrode 123 may be a lower metallic gate electrode. For example, metals, conductive metal nitrides, conductive metal oxides, conductive metal carbides or conductive metal carbonitrides may be included in the metallic conductive material. Hereinafter, embodiments of the inventive concept will be described with reference to the metallic conductive material including a metal and/or a metal alloy.

The first lower gate electrode 123 may include a first_1 lower gate electrode 121 and a first_2 lower gate electrode 122. The first_1 lower gate electrode 121 may be placed on the first gate insulating film 130. The first_1 lower gate electrode 121 may extend along the profile of the first gate insulating film 130. The first_2 lower gate electrode 122 may be placed on the first_1 lower gate electrode 121. The first_2 lower gate electrode 122 may extend along the profile of the first_1 lower gate electrode 121. The first_1 lower gate electrode 121 may be, for example, a p-type work function film. The first_1 lower gate electrode 121 may include, for example, but is not limited to, at least one of titanium nitride (TiN), tantalum carbide (TaC), tantalum nitride (TaN), titanium silicon nitride (TiSiN), tantalum silicon nitride (TaSiN) and/or tantalum carbonitride (TaCN). The first_2 lower gate electrode 122 may be, for example, an n-type work function film. The first_2 lower gate electrode 122 may include, for example, but is not limited to, at least one of titanium aluminum (TiAl), titanium aluminum nitride (TiAlN), titanium aluminum carbide (TiAlC), titanium aluminum carbonitride (TiAlCN), tantalum aluminum (TaAl), tantalum aluminum carbide (TaAlC), tantalum aluminum nitride (TaAlN), and/or tantalum aluminum carbonitrde (TaAlCN).

In other embodiments, the first lower gate electrode 123 may include only one of the first_1 lower gate electrode 121 and the first_2 lower gate electrode 122.

The first upper gate electrode 125 may be placed on the first lower gate electrode 123. The first upper gate electrode 125 may fill or at least partially fill the first gate trench 110t on which the first lower gate electrode 123 is formed.

The first upper gate electrode 125 may include a first semiconductor gate electrode 126 and a first upper metallic gate electrode 127.

The first semiconductor gate electrode 126 may be placed on the first lower gate electrode 123. The first semiconductor gate electrode 126 may fill or at least partially fill the first gate trench 110t on which the first lower gate electrode 123 is formed. The first semiconductor gate electrode 126 includes a semiconductor material. The first semiconductor gate electrode 126 may include, for example, a semiconductor material doped with impurities. The first semiconductor gate electrode 126 may include, for example, at least one of impurity-doped silicon, impurity-doped silicon germanium and/or impurity-doped germanium.

The first upper metallic gate electrode 127 may be placed on the first semiconductor gate electrode 126. Although the first upper metallic gate electrode 127 is shown as a single film, this is only for convenience of description, and the embodiments are not limited thereto. Although not shown, a metal silicide film may be further placed between the first semiconductor gate electrode 126 and the first upper metallic gate electrode 127.

The first upper metallic gate electrode 127 may include, for example, a metallic conductive material. The first upper metallic gate electrode 127 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), ruthenium aluminum (RuAl), nickel aluminum (NiAl), niobium diborode ($NbB_2$), molybdenum diboroide ($MoB_2$), tantalum diboride ($TaB_2$), vanadium aluminum carbide ($V_2AlC$) and chromium aluminum carbide (CrAlC), osmium (Os), silver (Ag), gold (Au), zinc (Zn), vanadium (V), and combinations thereof.

The first semiconductor gate electrode 126 includes an upper side 126US facing the first upper metallic gate electrode 127. The upper side 126US of the first semiconductor gate electrode may include a first wedge region 126US_W indented toward the substrate 100.

The upper side 126US of the first semiconductor gate electrode may include a first curved face 126_CS1 and a second curved face 126_CS1. The first curved face 126_CS1 and the second curved face 126_CS2 may have an upward convex shape on the basis of the upper side or surface 100US of the substrate in the cross-sectional view of FIG. 4.

The first wedge region 126US_W of the upper side 126US of the first semiconductor gate electrode may be defined by connecting the first curved face 126_CS1 and the second curved face 126_CS1. As an example, the first wedge region 126US_W of the upper side 126US of the first semiconductor gate electrode may be defined by directly connecting the first curved face 126_CS1 and the second curved face 126_CS1. As another example, unlike the shown example, in the first wedge region 126US_W of the upper side 126US of the first semiconductor gate electrode, the upper side 126US of the first semiconductor gate electrode may further include a connecting curved face that connects the first curved face 126_CS1 and the second curved face 126_CS1. The connecting curved face may have a convex shape toward the substrate 100, such as the bottom face of the first gate trench 110t.

Although the upper side of the first upper metallic gate electrode 127 is shown as not having a shape similar to the upper side 126US of the first semiconductor gate electrode, the embodiments are not limited thereto. Unlike the shown example, the upper side of the first upper metallic gate electrode 127 may include a wedge region similar to the upper side 126US of the first semiconductor gate electrode.

Unlike the shown example, the first gate electrode stack 120 may not include the first semiconductor gate electrode 126. That is, the first upper gate electrode 125 may be made up of only the first upper metallic gate electrode 127.

The first gate mask pattern 145 may be placed on the first gate electrode stack 120. The first gate mask pattern 145 may be placed on the first upper metallic gate electrode 127. The first gate mask pattern 145 may include, but is not limited to, an insulating material, and may include, for example, silicon oxide, silicon oxynitride, silicon nitride, and/or the like.

The first gate spacer 140 may be placed on the side wall of the first gate electrode stack 120. The first gate mask pattern 145 may be placed between the first gate spacers 140. The first gate spacer 140 is on and covers at least a part of the side wall of the first gate mask pattern 145. The first gate spacer 140 includes an insulating material, and may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN) and/or silicon oxycarbide (SiOC). Although the first gate spacer 140 is shown as a single film, this is only for convenience of description, and the embodiments are not limited thereto.

A first source/drain region 150 may be placed on both sides of the first gate electrode stack 120. The first source/drain region 150 may be formed inside the substrate 100.

The first source/drain region 150 may be formed inside and/or beneath a first silicon-germanium film 110 placed on the upper side or surface 100US of the substrate as shown in the cross-sectional view of FIG. 1. For example, a part of the first source/drain region 150 may be placed inside the first silicon-germanium film 110.

An interlayer insulating film 190 is placed on the substrate 100. The interlayer insulating film 190 is on and at least partially covers the first source/drain region 150 and the first gate mask pattern 145. The interlayer insulating film 190 may include, for example, at least one of silicon oxide, silicon nitride, and/or silicon oxynitride.

A first contact 180 may penetrate the interlayer insulating film 190 and be connected to the first source/drain region 150. An upper face of the first contact 180 may be higher than the upper face of the first gate mask pattern 145 in the cross-sectional view of FIG. 1.

The first contact 180 may include, for example, a conductive material. The first contact 180 may include, for example, at least one of a metal, a conductive metal nitride, a conductive metal carbonitride, a conductive metal carbide, a metal silicide, a doped semiconductor material, a conductive metal oxynitride, a conductive metal oxide and/or a two-dimensional (2D) material. Although the first contact 180 is shown as a single film, this is only for convenience of description, and the embodiment is not limited thereto.

Figure 3:
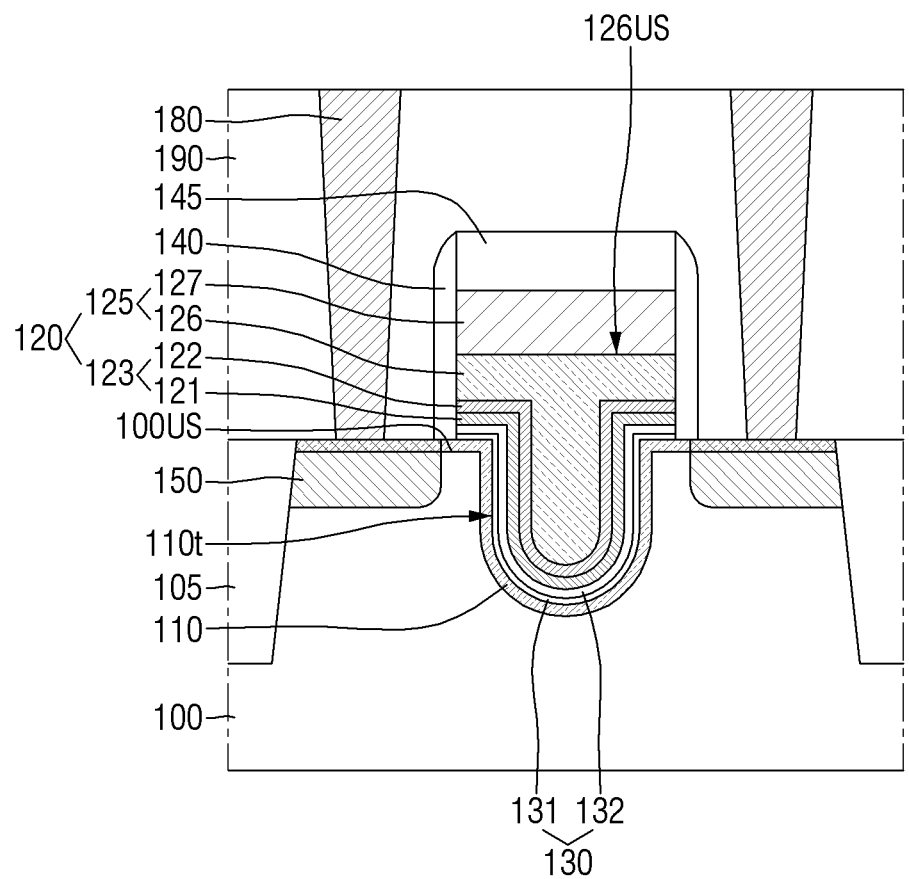
FIG. 3 is a diagram that illustrates the semiconductor device according to some embodiments of the inventive concept.

FIG. 3 is a diagram that illustrates the semiconductor device according to some embodiments of the inventive concept. For convenience of description, feature differences from those explained using FIGS. 1 and 2B will be described.

Referring to FIG. 3, in the semiconductor device according to some embodiments, the upper side 126US of the first semiconductor gate electrode does not include the wedge region (126US_W of FIG. 1).

The upper side 126US of the first semiconductor gate electrode does not include a portion indented toward the substrate 100. For example, the upper side 126US of the first semiconductor gate electrode may be flattened, like the upper side or surface 100US of the substrate.

Figure 4:
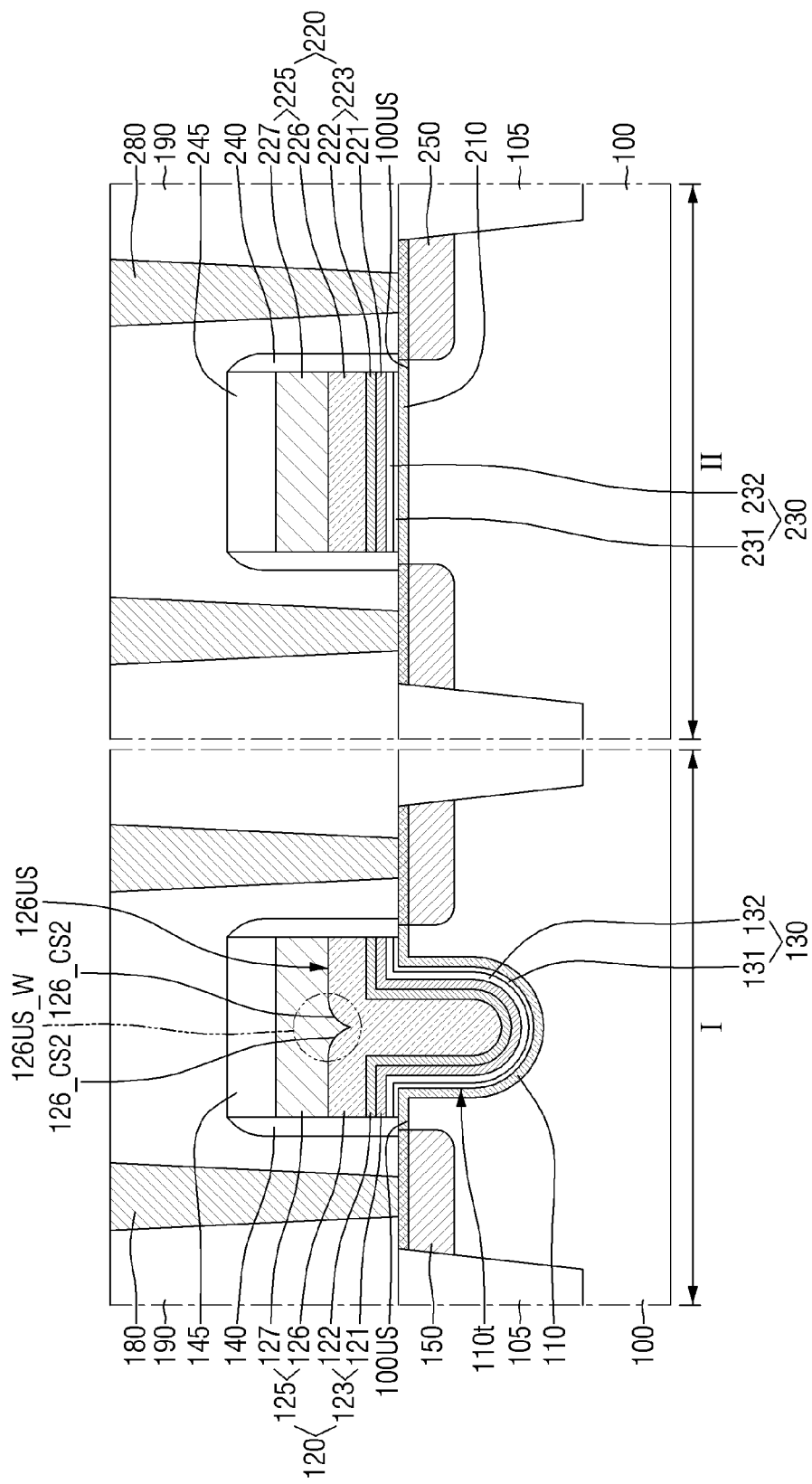
FIG. 4 is a diagram that illustrates the semiconductor device according to some embodiments of the inventive concept.

FIG. 4 is a diagram that illustrates a semiconductor device according to some embodiments of the inventive concept. For convenience of explanation, feature differences from those illustrates using FIGS. 1 and 2B will be described. For reference, the drawing shown in the first region I of FIG. 4 may be substantially the same as that of FIG. 1. That is, the description of the first region I of FIG. 4 is substantially the same as that described with reference to FIGS. 1 to 2B. The embodiments of FIG. 4 will be described with reference to the second region II.

Referring to FIG. 4, the semiconductor device according to some embodiments may include the substrate 100, the first silicon-germanium film 110, the first gate electrode stack 120, the first gate insulation film 130, the first source/drain region 150, the second silicon-germanium film 210, the second gate electrode stack 220, the second gate insulating film 230, and the second source/drain region 250.

The substrate 100 may include a first region I and a second region II. The first region I and the second region II may be regions spaced apart from each other or may be regions connected to each other. In the semiconductor device according to some embodiments, the first region I and the second region II may each be a MOSFET formation region.

The first silicon-germanium film 110, the first gate electrode stack 120, the first gate insulating film 130, and the first source/drain region 150 may be placed in the first region I of the substrate 100.

The second silicon-germanium film 210, the second gate electrode stack 220, the second gate insulating film 230, and the second source/drain region 250 may be placed in the second region II of the substrate 100.

The second silicon-germanium film 210 may be formed on the substrate 100. The second silicon-germanium film 210 may be formed conformally on the substrate 100. The second silicon-germanium film 210 may be placed on the upper side or surface 100US of a flat substrate. The second silicon-germanium film 210 may extend along the upper side or surface 100US of the substrate. Unlike the first silicon-germanium film 110, a gate trench extending from the upper side or surface 100US of the substrate in the thickness direction of the substrate 100 is not defined by the second silicon-germanium film 210. The second silicon-germanium film 210 may be formed of a silicon germanium film. For example, the second silicon-germanium film 210 may include a single crystal silicon germanium film.

The second gate insulating film 230 may be placed on the second silicon-germanium film 210. The second gate insulating film 230 may come into contact with the second silicon-germanium film 210. The second gate insulating film 230 may extend along the profile of the second silicon-germanium film 210. The second gate insulating film 230 may be placed on the upper side or surface 100US of the flat substrate 100. The second gate insulating film 230 may include a second interfacial film 231 and a second high dielectric constant insulating film 232, which are sequentially placed on the second silicon-germanium film 210. The material included in the second gate insulating film 230 may be the same as or similar to the material of the first gate insulating film 130.

The germanium fraction of the second silicon-germanium film 210 may change, with increasing distance from the second gate insulating film 230. For example, the germanium fraction of the second silicon-germanium film 210 decreases with increasing distance from the second gate insulating film 230.

The second gate electrode stack 220 may be placed on the second gate insulating film 230. The second gate electrode stack 220 may not include any portion that is placed at a position lower than the upper side or surface of the substrate 100US in the cross-sectional view of FIG. 4. The second gate electrode stack 220 may include a second lower gate electrode 223 and a second upper gate electrode 225.

The second lower gate electrode 223 may be placed on the second gate insulating film 230. The second lower gate electrode 223 may extend along the profile of the second gate insulating film 230. The second lower gate electrode 223 may be, for example, a metallic gate electrode including a metallic conductive material.

The second lower gate electrode 223 may include a second_1 lower gate electrode 221 and a second_2 lower gate electrode 222, which are sequentially placed on the second gate insulating film 230. The second_1 lower gate electrode 221 may be, for example, a p-type work function film. The second_2 lower gate electrode 222 may be, for example, an n-type work function film.

The second upper gate electrode 225 may be placed on the second lower gate electrode 223. The second upper gate electrode 225 may include a second semiconductor gate electrode 226 and a second upper metallic gate electrode 227. The upper side of the second semiconductor gate electrode 226 does not include the wedge region (126US_W of FIG. 1).

The second gate electrode stack 220 may be formed at the same level as the first gate electrode stack 120. Here, the term "same level" means that they are formed by the same fabricating process and are at a same level relative to the substrate 100 in the cross-sectional view of FIG. 4. The stack structure of the second gate electrode stack 220 may be the same as the stack structure of the first gate electrode stack 120, except that a part of the first gate electrode stack 120 is located to be lower than the upper side or surface 100US of the substrate in the cross-sectional view of FIG. 4.

A second gate mask pattern 245 may be placed on the second gate electrode stack 220. The second gate mask pattern 245 may be placed on the second upper metallic gate electrode 227. The second gate mask pattern 245 may include an insulating material. The second gate spacer 240 may be placed on the side wall of the second gate electrode stack 220. The second gate mask pattern 245 may be placed between the second gate spacers 240. The second gate spacer 240 is on and covers at least a part of the side wall of the second gate mask pattern 245. The second gate spacer 240 includes an insulating material.

The second source/drain region 250 may be placed on both sides of the second gate electrode stack 220. The second source/drain region 250 may be formed inside the substrate 100.

The second source/drain region 250 may be formed inside and/or below the second silicon-germanium film 210 placed on the upper side or surface 100US of the substrate in the cross-sectional view of FIG. 4. For example, a part of the second source/drain region 250 may be placed inside the second silicon-germanium film 210.

A second contact 280 may penetrate the interlayer insulating film 190 and be connected to the second source/drain region 250. An upper face of the second contact 280 may be higher than the upper face of the second gate mask pattern 245 in the cross-sectional view of FIG. 4.

Figure 5:
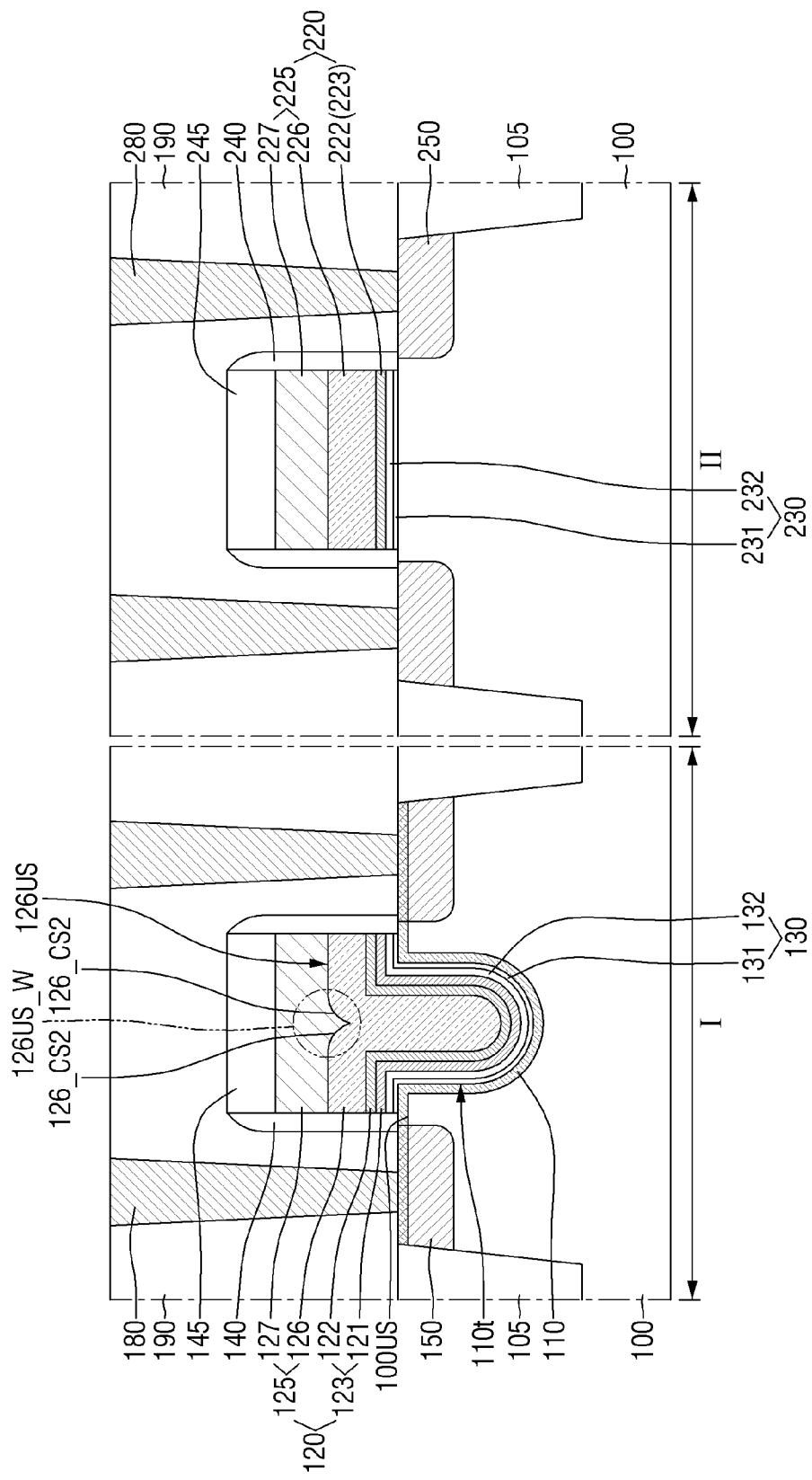
FIG. 5 is a diagram that illustrates the semiconductor device according to some embodiments of the inventive concept.

FIG. 5 is a diagram that illustrates a semiconductor device according to some embodiments of the inventive concept. For convenience of explanation, feature differences from those described with reference to FIGS. 1 to 2B and 4 will be described.

Referring to FIG. 5, in the semiconductor device according to some embodiments, the first region I may be a PMOS formation region, and the second region II may be a NMOS formation region.

The second gate insulating film 230 may come into physical contact with the substrate 100. For example, the second interfacial film 231 may come into physical contact with the substrate 100.

The second silicon-germanium film 210 described with reference to FIG. 4 is not placed between the second gate insulating film 230 and the substrate 100.

The second lower gate electrode 223 may include a second_2 lower gate electrode 222. As an example, the second lower gate electrode 223 does not include the second_1 lower gate electrode (221 of FIG. 4) between the second_2 lower gate electrode 222 and the second gate insulating film 230. Unlike the shown example, as another example, the second lower gate electrode 223 may include the second_1 lower gate electrode (221 of FIG. 4) between the second_2 lower gate electrode 222 and the second gate insulating film 230. The thickness of the first_1 lower gate electrode 121 formed in the first region I may be thicker than the thickness of the second_1 lower gate electrode 221 formed in the second region II.

Figure 6:
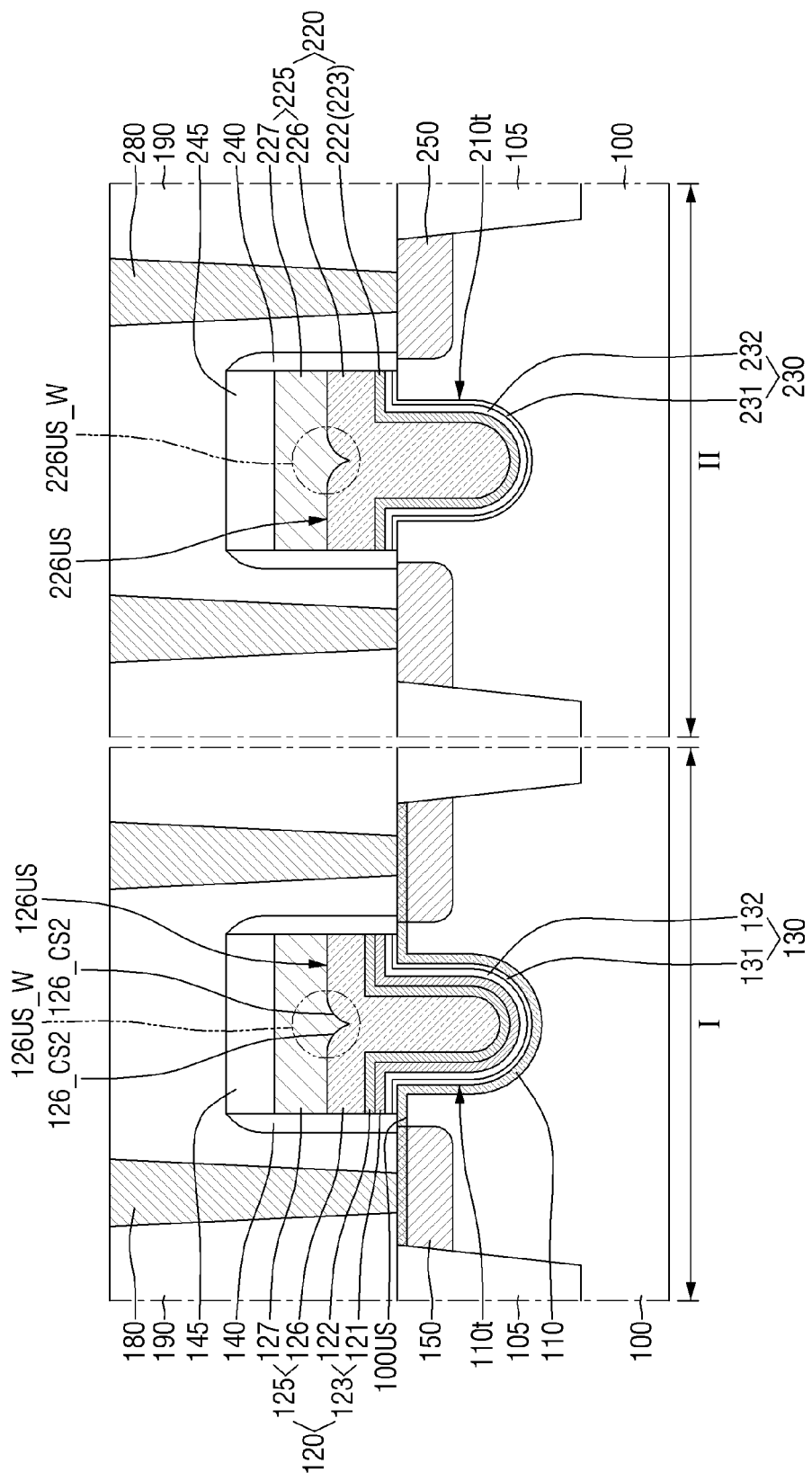
FIG. 6 is a diagram that illustrates the semiconductor device according to some embodiments of the inventive concept.

FIG. 6 is a diagram that illustrates a semiconductor device according to some embodiments of the inventive concept. For convenience of explanation, feature differences from those described with reference to FIGS. 1 to 2B and 5 will be described.

Referring to FIG. 6, in the semiconductor device according to some embodiments, the substrate 100 of the second region II may include a second gate trench 210t.

The second gate trench 210t may extend from the upper side or surface 100US of the substrate into the substrate 100. The second gate trench 210t may extend from the upper side or surface 100US of the substrate in the thickness direction of the substrate 100.

The second gate insulating film 230 may extend along the profile of the second gate trench 210t.

The second gate electrode stack 220 may be in and at least partially fill the second gate trench 210t. The second lower gate electrode 223 may extend along the profile of the second gate insulating film 230. For example, the second lower gate electrode 223 may fill a part of the second gate trench 210t in which the second gate insulating film 230 is formed.

The second upper gate electrode 225 may be in and at least partially fill the second gate trench 210t in which the second lower gate electrode 223 is formed. The second semiconductor gate electrode 226 may be in and at least partially fill the second gate trench 210t in which the second lower gate electrode 223 is formed.

The second semiconductor gate electrode 226 includes an upper side 226US facing the second upper metallic gate electrode 227. The upper side 226US of the second semiconductor gate electrode may include a second wedge region 226US_W indented towards the substrate 100. The description of the second wedge region 226US_W may be substantially the same as the description of the first wedge region 126US_W provided with reference to FIG. 1.

Figure 7:
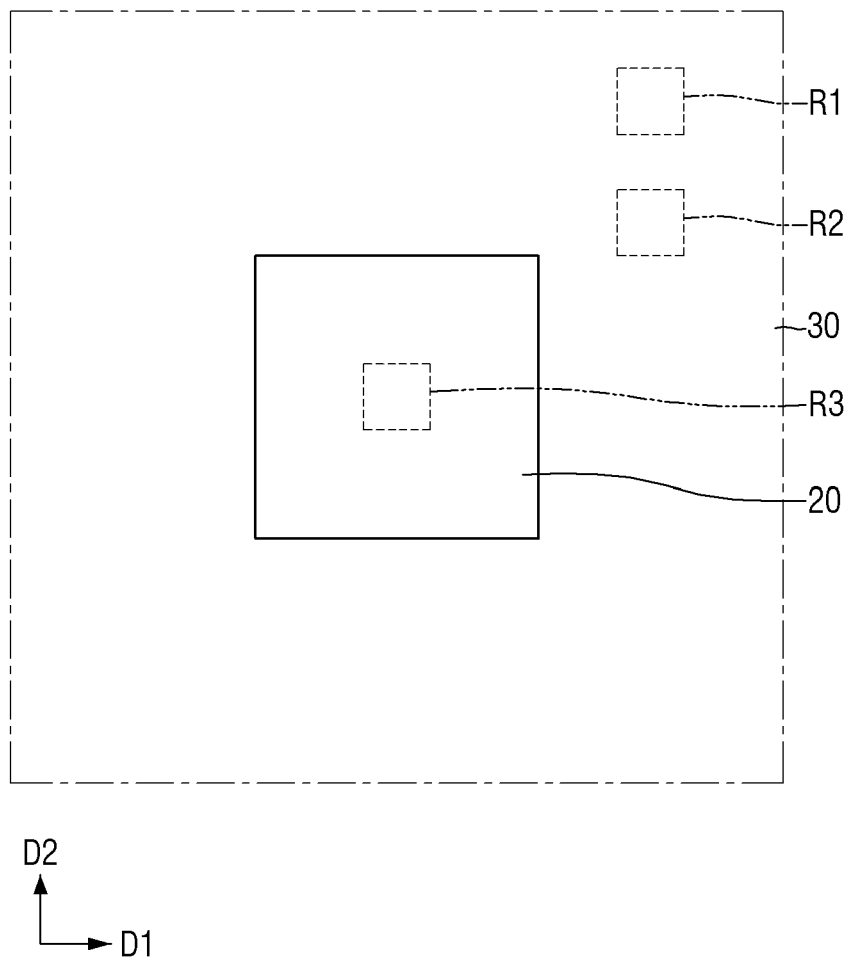
FIG. 7 is a schematic layout diagram of the semiconductor device according to some embodiments of the inventive concept.
Figure 8:
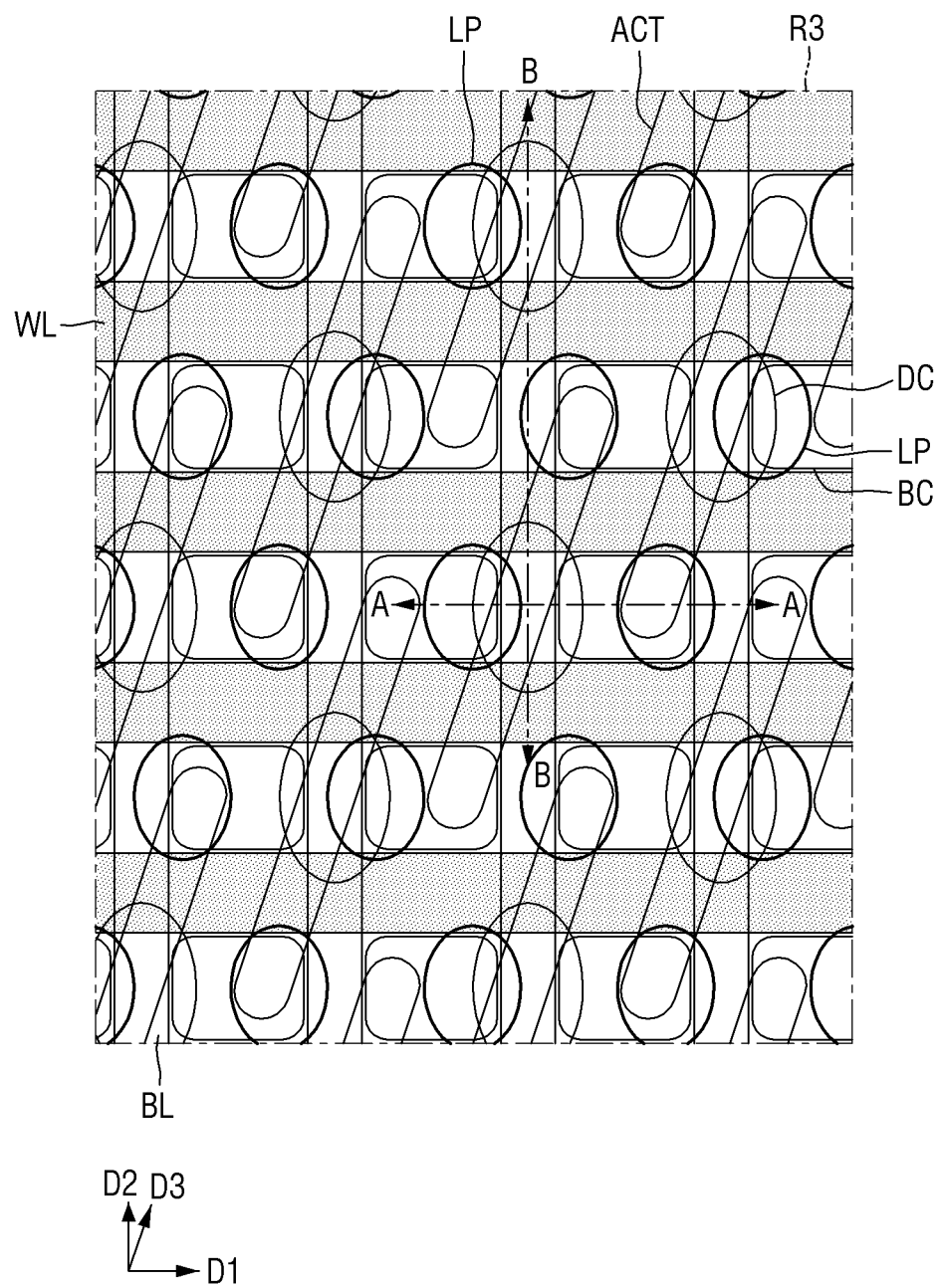
FIG. 8 is an enlarged schematic layout diagram showing a portion R3 of FIG. 7.
Figure 9:
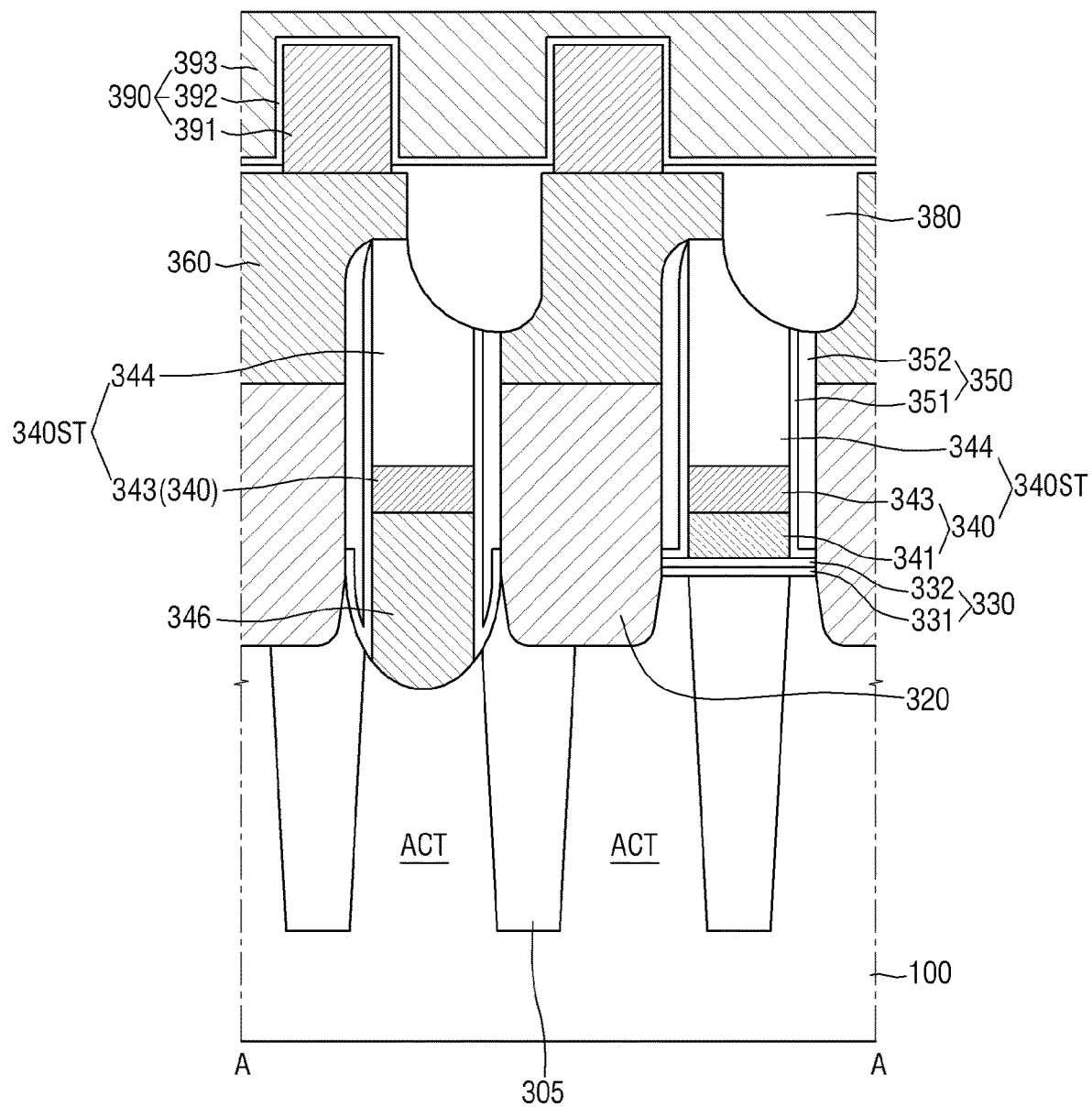
FIG. 9 is a cross-sectional view taken along A-A of FIG. 8.
Figure 10:
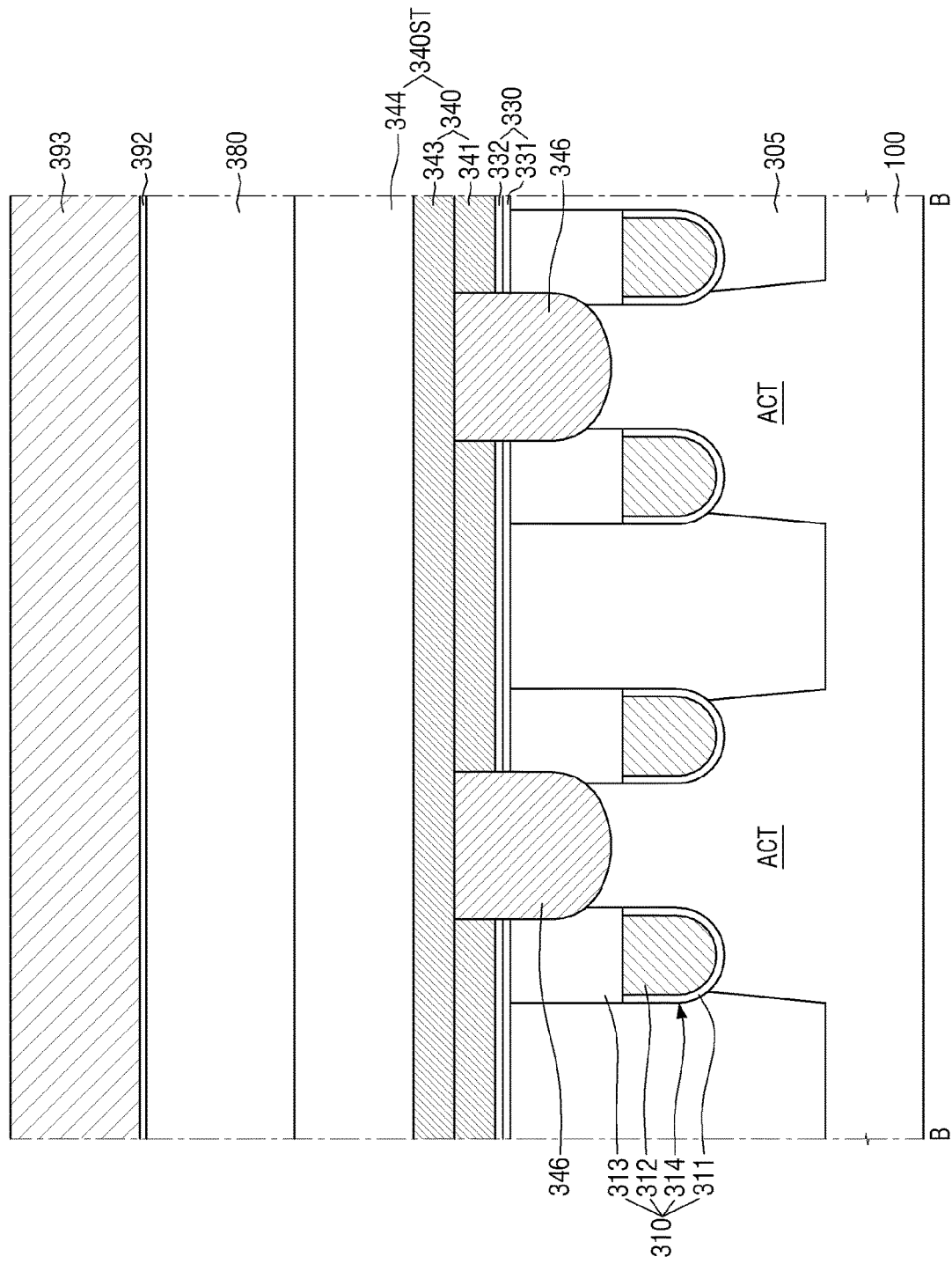
FIG. 10 is a cross-sectional view taken along B-B of FIG. 8.

FIG. 7 is a schematic layout diagram of the semiconductor device according to some embodiments of the inventive concept. FIG. 8 is an enlarged schematic layout diagram showing a portion R3 of FIG. 7. FIG. 9 is a cross-sectional view taken along A-A of FIG. 8. FIG. 10 is a cross-sectional view taken along B-B of FIG. 8. For reference, although a DRAM (Dynamic Random Access Memory) is shown as an example in the drawings of the semiconductor device according to some embodiments, the embodiments are not limited thereto. Further, FIG. 8 shows a layout diagram except for the first capacitor 390 of FIG. 9.

Referring to FIG. 7, the semiconductor device according to some embodiments may include a cell region 20, and a peri-region 30 defined around the cell region 20.

The substrate (100 of FIG. 1) may include a cell region 20 and a peri-region 30. For example, the cell region 20 may be a region in which memory cells are placed. The peri-region 30 may be a region in which a circuit for operating the memory cells of the cell region 20 is placed.

A cross-sectional view of the portion R1 of FIG. 7 cut in the first direction D1 or second direction D2 may be a first cross-sectional view. A cross-sectional view of the portion R2 of FIG. 7 cut in the first direction D1 or the second direction D2 may be a second cross-sectional view. The first direction D1 may intersect the second direction D2.

As an example, the first cross-sectional view and the second cross-sectional view may be one of FIG. 1 or FIG. 3. As another example, the first cross-sectional view may be the drawing shown in the first region I of FIGS. 4 to 6, and the second cross-sectional view may be the drawing shown in the second region II of FIGS. 4 to 6. As still another example, the first cross-sectional view may be the drawing shown in the second region II of FIGS. 4 to 6, and the second cross-sectional view may be the drawing shown in the first region I of FIGS. 4 to 6.

In some embodiments, the semiconductor device embodiments described with reference to FIGS. 1 to 6 may be placed in the peri-region 30 of FIG. 7.

Because the description of the portion R1 of FIG. 7 and the portion R2 of FIG. 7 are similar to those described using FIGS. 1 to 6, the following description is directed to the portion R3 of FIG. 7.

Referring to FIG. 8, the semiconductor device according to some embodiments may include a plurality of first active regions ACT. The first active region ACT may be defined by a second element isolation film (305 of FIG. 9) formed inside the substrate (100 of FIG. 9).

With a decrease in design rules of semiconductor devices, the first active region ACT may be placed in the form of a bar of a diagonal line or oblique line, as shown. The first active region ACT may have the shape of a bar extending in the third direction D3.

A plurality of gate electrodes may be placed on the first active region ACT in the first direction D1 across the first active region ACT. The plurality of gate electrodes may extend parallel to each other. The plurality of gate electrodes may be, for example, a plurality of word lines WL.

The word lines WL may be spaced at equal intervals. A width of the word line WL or a gap between the word lines WL may be determined based on the design rules.

A plurality of bit lines BL extending in the second direction D2 orthogonal to the word line WL may be placed on the word line WL. The plurality of bit lines BL may extend in the second direction D2 across the first active region ACT.

The plurality of bit lines BL may extend parallel to each other. The bit lines BL may be placed at equal intervals. A width of the bit line BL or a gap between the bit lines BL may be determined based on the design rules.

The semiconductor device according to some embodiments may include various contact arrangements formed on the first active region ACT. Various contact arrangements may include, for example, a direct contact DC, a buried contact BC, a landing pad LP and the like.

Here, the direct contact DC may mean a contact that electrically connects the first active region ACT to the bit line BL. The buried contact BC may mean a contact that connects the first active region ACT to the first lower electrode (391 of FIG. 9) of the first capacitor (390 of FIG. 9).

Due to the arrangement structure, the contact area between the buried contact BC and the first active region ACT may be small. Accordingly, to enlarge the contact area with the first active region ACT and enlarge the contact area with the first lower electrode (391 of FIG. 9) of the first capacitor, the conductive landing pad LP may be introduced.

The landing pad LP may be placed between the first active region ACT and the buried contact BC, and may also be placed between the buried contact BC and the first lower electrode (391 of FIG. 9) of the first capacitor. In the semiconductor device according to some embodiments of the inventive concept, the landing pad LP may be placed between the buried contact BC and the first lower electrode (391 of FIG. 9) of the first capacitor. By enlarging the contact area through introduction of the landing pad LP, the contact resistance between the first active region ACT and the first lower electrode (391 of FIG. 9) of the first capacitor may be reduced.

In the semiconductor device according to some embodiments, the direct contact DC may be placed at the central portion of the first active region ACT. The buried contact BC may be placed at both end portions of the first active region ACT. As the buried contact BC is placed at both end portions of the first active region ACT, the landing pad LP may be placed to partially overlap the buried contact BC to be adjacent to both ends of the first active region ACT. Described in another way, the buried contact BC may be formed to overlap the first active region ACT and a second element isolation film (305 of FIG. 9) between the adjacent word lines WL, and between the adjacent bit lines BL.

The word line WL may be formed as a structure buried inside the substrate 100. The word line WL may be placed across the first active region ACT between the direct contacts DC or between the buried contacts BC.

As shown, two word lines WL may be placed across one first active region ACT. By placing the first active region ACT diagonally, the word line WL may have an angle of less than 90 degrees with the first active region ACT.

The direct contact DC and the buried contact BC may be placed symmetrically. Therefore, the direct contact DC and the buried contact BC may be placed on a straight line along the first direction D1 and the second direction D2.

On the other hand, unlike the direct contact DC and the buried contact BC, the landing pad LP may be placed in a zigzag manner in the second direction D2 along which the bit line BL extends. Also, the landing pad LP may be placed to overlap the same side portion of each bit line BL in the first direction D1 along which the word line WL extends.

For example, each of the landing pads LP of the first line overlaps the left side of the corresponding bit line BL, and each of the landing pads LP of the second line may overlap the right side of the corresponding bit line BL.

Referring to FIGS. 8 to 10, the semiconductor device according to some embodiments may include a second element isolation film 305, a plurality of gate structures 310, a plurality of bit line structures 340ST, a bit line contact 346, a storage contacts 320, and a first capacitor 390.

The first active region ACT defined by the second element isolation film 305 may have a long island shape including a minor axis and a major axis as shown in FIG. 8. The first active region ACT may have an oblique line shape to have an angle of less than 90 degrees with respect to the word line WL formed in the second element isolation film 305. Further, the first active region ACT may have an oblique line shape to have an angle of less than 90 degrees with respect to the bit line BL formed on the second element isolation film 305.

The gate structure 310 may be formed in the substrate 100 and the second element isolation film 305. The gate structure 310 may be formed across the second element isolation film 305 and the first active region ACT defined by the second element isolation film 305. That is, one gate structure 310 may be formed in the substrate 100 and the second element isolation film 305 located in the first direction D1 along which the gate structure 310 extends.

The gate structure 310 may include a third gate trench 314, a third gate insulating film 311, a first gate electrode 312 and a gate capping pattern 313 formed in the substrate 100 and the second element isolation film 305. Here, the first gate electrode 312 may correspond to the word line WL.

The third gate insulating film 311 may extend along the side walls and a bottom face of the third gate trench 314. The third gate insulating film 311 may include at least one of silicon oxide, silicon nitride, silicon oxynitride and/or a high dielectric constant material having a higher dielectric constant than silicon oxide. The high dielectric constant material may be the same material as the first high dielectric constant insulating film 132 of FIG. 1.

The first gate electrode 312 may be formed on the third gate insulating film 311. The first gate electrode 312 may fill a part of the third gate trench 314. The first gate electrode 312 may include at least one of a metal, a conductive metal nitride, a conductive metal carbonitride, a conductive metal carbide, a metal silicide, a doped semiconductor material, a conductive metal oxynitride, and/or a conductive metal oxide. The first gate electrode 312 may be made up of, for example, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof.

Although not shown, an impurity doping region may be formed on at least one side of the gate structure 310. The impurity doping region may be a source/drain region of the transistor.

The gate capping pattern 313 may be formed on the first gate electrode 312. The gate capping pattern 313 may be in and at least partially fill the third gate trench 314 that remains after the first gate electrode 312 is formed. The gate capping pattern 313 includes an insulating material.

A bit line structure 340ST may include a cell conductive line 340 and a cell line capping film 344. The cell conductive line 340 may be formed on the substrate 100 and the second element isolation film 305 on which the gate structure 310 is formed. The cell conductive line 340 may intersect the second element isolation film 305 and the first active region ACT defined by the second element isolation film 305. The single cell conductive line 340 may be formed on the substrate 100 and the second element isolation film 305 located in the second direction D2 along which the cell conductive line 340 extends. The cell conductive line 340 may be formed to intersect the gate structure 310. The cell conductive line 340 may correspond to the bit line BL.

The cell conductive line 340 may include a lower cell conductive line 341, and an upper cell conductive line 342 on the lower cell conductive line 341. In the semiconductor device according to some embodiments, the cell conductive line 340 may have the same stack structure as the first upper gate electrode (125 of FIG. 1) and the second upper gate electrode (225 of FIG. 4). For example, when the first upper gate electrode 125 and the second upper gate electrode 225 have a multi-film structure, the cell conductive line 340 may have the same the multi-film structure as the first upper gate electrode 125 and the second upper gate electrode 225.

In other embodiments, when the conductive material included in the lower cell conductive line 341 of the cell region (20 of FIG. 7) is formed, the conductive material included in the first semiconductor gate electrode 126 of the peri-region (30 of FIG. 8) may be formed. Also, when the conductive material included in the upper cell conductive line 342 of the cell region (20 of FIG. 7) is formed, the conductive material included in the first upper metallic gate electrode 127 of the peri-region (30 of FIG. 8) may be formed.

The bit line contact 346 may be formed between the cell conductive line 340 and the substrate 100. That is, the cell conductive line 340 may be formed on the bit line contact 346. For example, the bit line contact 346 may be formed at a point where the cell conductive line 340 intersects the central portion of the first active region ACT having a long island shape. The bit line contact 346 may be formed between the substrate 100 of the central portion of the first active region ACT and the cell conductive line 340. The bit line contact 346 may electrically connect the cell conductive line 340 and the substrate 100. The bit line structure 340ST may be connected to the first active region ACT through the bit line contact 346. The bit line contact 346 may correspond to the direct contact DC. The bit line contact 346 may include, for example, at least one of an impurity-doped semiconductor material, a conductive silicide compound, a conductive metal nitride, a conductive metal oxide and/or a metal.

The cell line capping film 344 may be placed on the cell conductive line 340. The cell line capping film 344 includes an insulating material.

The cell insulating film 330 may be formed on the substrate 100 and the second element isolation film 305. The cell insulating film 330 may be formed on the substrate 100 and the second element isolation film 305 on which the bit line contact 346 is not formed. The cell insulating film 330 may be formed between the substrate 100 and the cell conductive line 340, and between the second element isolation film 305 and the cell conductive line 340. Although the cell insulating film 330 may be a single film, as shown, the cell insulating film 330 may be a multi-film including the first cell insulating film 331 and the second cell insulating film 332. For example, the first cell insulating film 331 may include an oxide film, and the second cell insulating film 332 may include a nitride film, but the embodiments are not limited thereto.

The cell line spacer 350 may be placed on the side walls of the cell conductive line 340 and the cell line capping film 344. Although the cell line spacer 350 may be a single film, as shown, the cell line spacer 350 may be a multi-film including the first cell line spacer 351 and the second cell line spacer 352. For example, the first and second cell line spacers 351 and 352 may include, but are not limited to, one of silicon oxide film, silicon nitride film, silicon oxynitride film (SiON), silicon oxycarbonitride film (SiOCN), air and combinations thereof.

A storage contact 320 may be formed between adjacent cells conductive lines 340. The storage contact 320 may overlap the substrate 100 and the second element isolation film 305 between adjacent cell conductive lines 340. Here, the storage contact 320 may correspond to the buried contact BC. The storage contact 320 may include, for example, at least one of an impurity-doped semiconductor material, a conductive silicide compound, a conductive metal nitride, a conductive metal oxide, and/or a metal.

A storage pad 360 may be formed on the storage contact 320. The storage pad 360 may be electrically connected to the storage contact 320. Here, the storage pad 360 may correspond to the landing pad LP. The storage pad 360 may include, for example, at least one of an impurity-doped semiconductor material, a conductive silicide compound, a conductive metal nitride, a conductive metal oxide, and/or a metal.

A pad isolation insulating film 380 may be formed on the storage pad 360 and the bit line structure 340ST. For example, the pad isolation insulating film 380 may be placed on the cell line capping film 344. The pad isolation insulating film 380 may define a region of the storage pad 360, which forms a plurality of isolated regions. Further, the pad isolation insulating film 380 may be patterned to expose at least a part of the upper face of the storage pad 360. The pad isolation insulating film 380 includes an insulating material.

A first capacitor 390 may be formed on the pad isolation insulating film 380. The first capacitor 390 may be electrically connected to the storage contact 320 through the storage pad 360. The first capacitor 390 includes a first lower electrode 391, a first capacitor dielectric film 392, and a first upper electrode 393.

The first lower electrode 391 may be placed on the storage pad 360. Although the first lower electrode 391 is shown to have a pillar shape, the embodiments are not limited thereto. The first lower electrode 391 may have a cylinder shape. The first capacitor dielectric film 392 is formed on the first lower electrode 391. The first capacitor dielectric film 392 may be formed along the profile of the first lower electrode 391. The first upper electrode 393 is formed on the first capacitor dielectric film 392. The first upper electrode 393 may wrap the outer walls of the first lower electrode 391.

The first lower electrode 391 and the first upper electrode 393 may include, for example, but are not limited to, a doped semiconductor material, a conductive metal nitride (e.g., titanium nitride, tantalum nitride, niobium nitride or tungsten nitride, etc.), metals (e.g., ruthenium, iridium, titanium or tantalum, etc.), and/or conductive metal oxides (e.g., iridium oxide or niobium oxide, etc.).

The first capacitor dielectric film 392 may include, for example, but is not limited to, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

Figure 11:
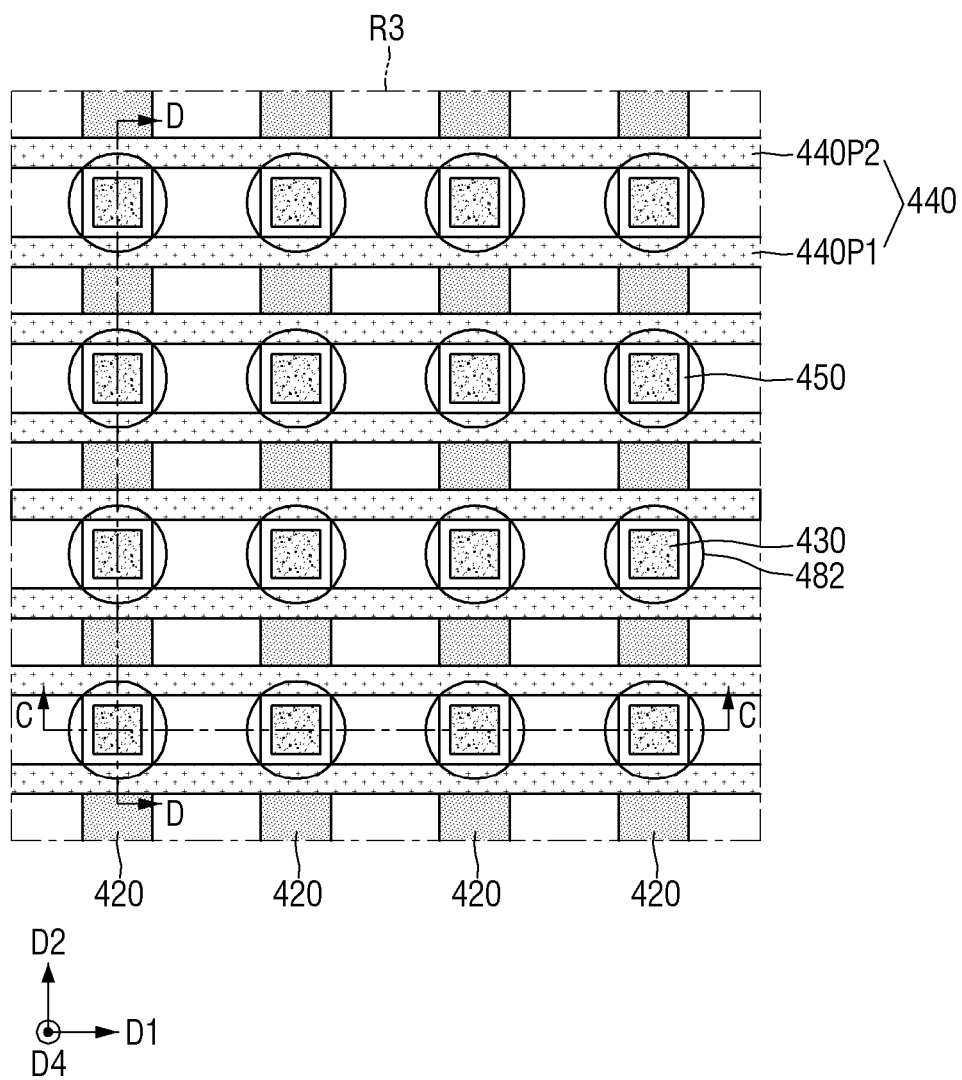
FIG. 11 is a layout diagram that illustrates the semiconductor device according to some embodiments of the inventive concept.
Figure 12:
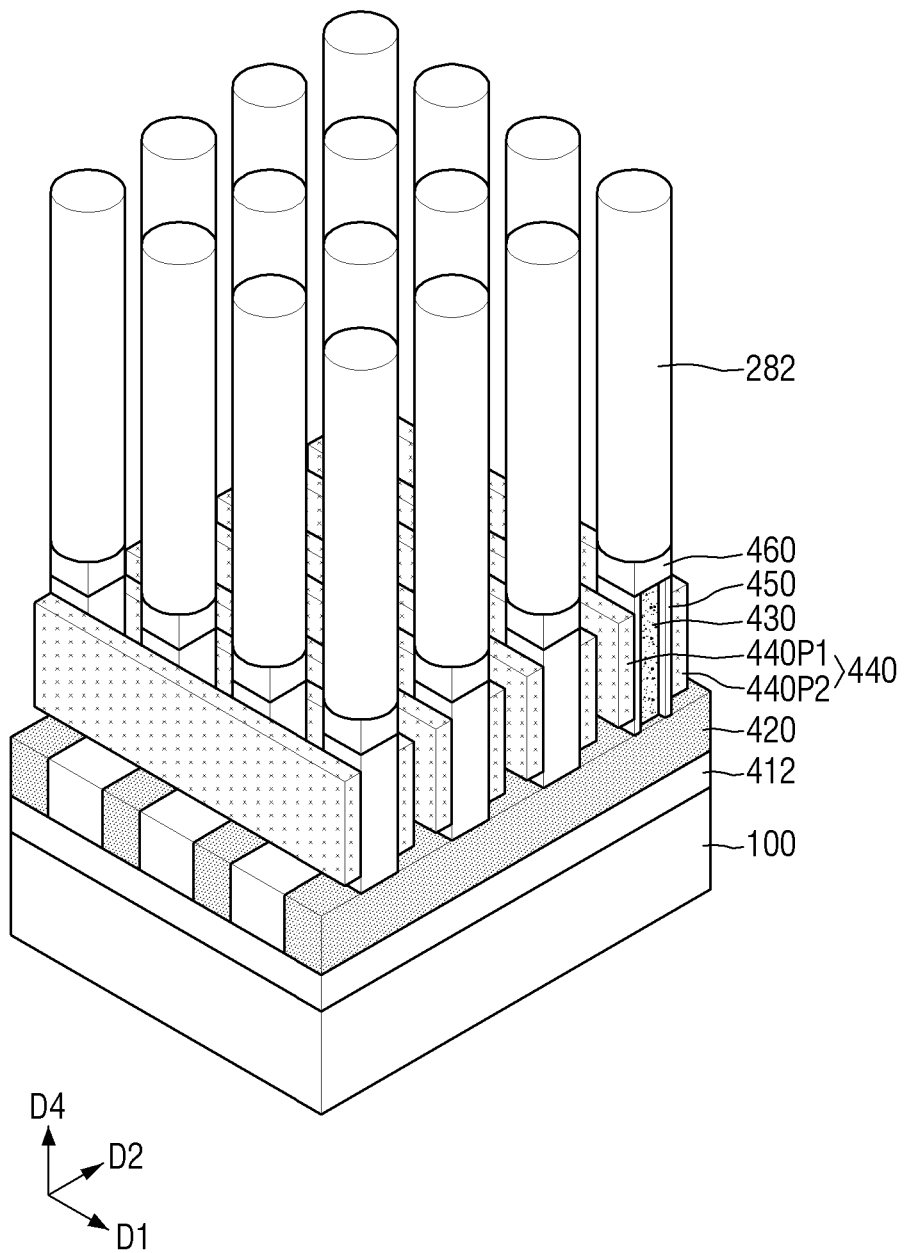
FIG. 12 is a perspective view that illustrates the semiconductor device according to some embodiments of the inventive concept.
Figure 13:
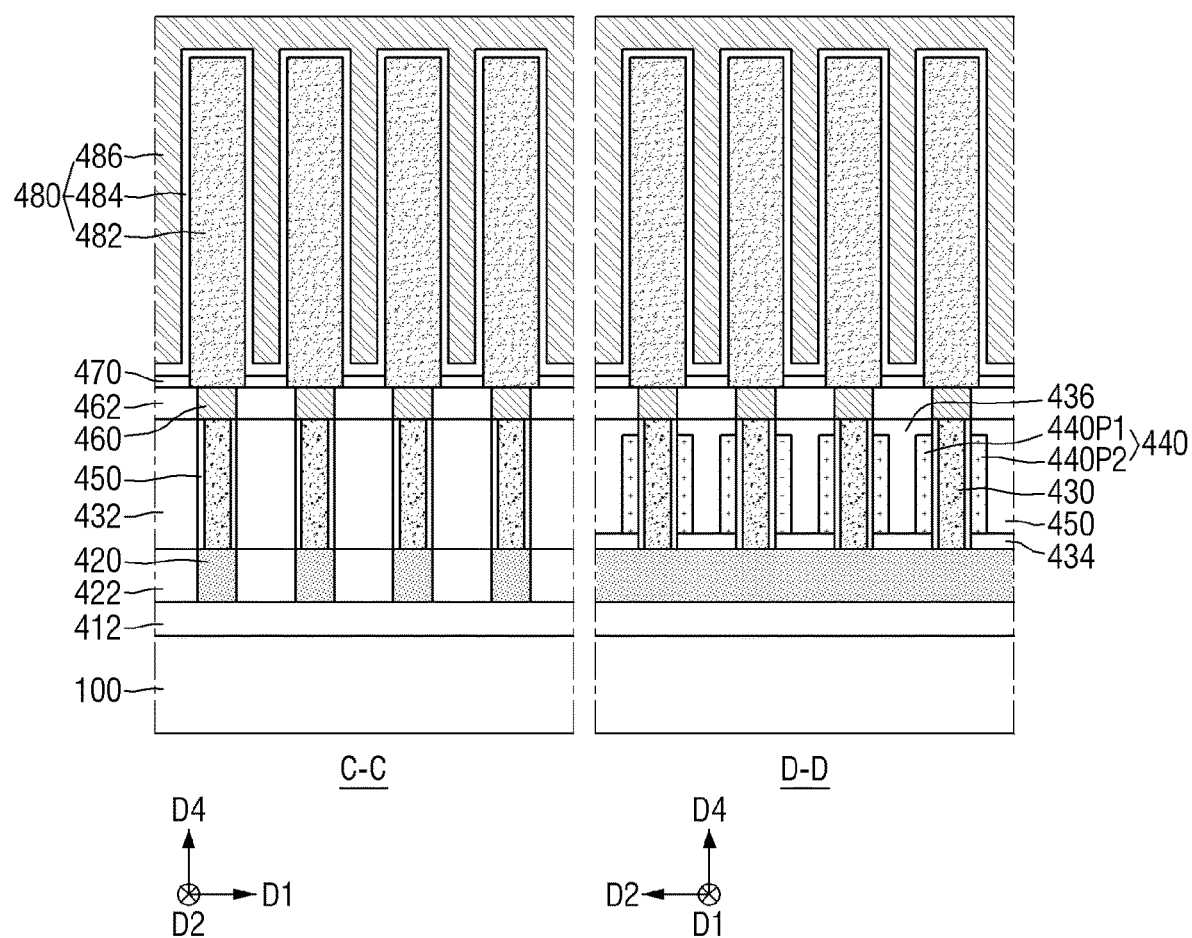
FIG. 13 is a cross-sectional view taken along C-C and D-D of FIG. 11.

FIG. 11 is a layout diagram that illustrates a semiconductor device according to some embodiments of the inventive concept. FIG. 12 is a perspective view that illustrates the semiconductor device according to some embodiments of the inventive concept. FIG. 13 is a cross-sectional view taken along C-C and D-D of FIG. 11. For reference, FIG. 11 may be an enlarged view of a portion R3 of FIG. 7.

Referring to FIGS. 11 to 13, the semiconductor device according to some embodiments may include a substrate 100, a plurality of first conductive lines 420, a channel layer 430, a second gate electrode 440, a fourth gate insulating film 450 and a second capacitor 480. The semiconductor device according to some embodiments may be a memory device including a vertical channel transistor VCT. The vertical channel transistor may refer to a structure in which a channel length of the channel layer 430 extends from the substrate 100 along the vertical direction, i.e., the D4 direction.

A lower insulating layer 412 may be placed on the substrate 100. A plurality of first conductive lines 420 may be spaced apart from each other in the first direction D1 on the lower insulating layer 412 and extend in the second direction D2. A plurality of first insulating patterns 422 may be placed on the lower insulating layer 412 to fill a space between the plurality of first conductive lines 420. The plurality of first insulating patterns 422 may extend in the second direction D2. The upper faces of the plurality of first insulating patterns 422 may be placed at the same level as the upper faces of the plurality of first conductive lines 420 in the cross-sectional view of FIG. 13. The plurality of first conductive lines 420 may function as bit lines.

The plurality of first conductive lines 420 may include a doped semiconductor material, a metal, a conductive metal nitride, a conductive metal silicide, a conductive metal oxide or a combination thereof. For example, the plurality of first conductive lines 420 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof. The plurality of first conductive lines 420 may include a single layer or multi-layers of the materials listed above. In the example embodiments, the plurality of first conductive lines 420 may include graphene, carbon nanotube or a combination thereof.

The channel layer 430 may be placed in a matrix form that is spaced apart in the first direction D1 and the second direction D2 on the plurality of first conductive lines 420. The channel layer 430 may have a first width along the first direction D1 and a first height along a fourth direction D4, and the first height may be greater than the first width. Here, the fourth direction D4 may be, for example, a direction intersecting the first direction D1 and the second direction D2 and perpendicular to the upper side or surface of the substrate 100. For example, the first height may be, but is not limited to, about 2 to 10 times the first width. A bottom portion of the channel layer 430 functions as a third source/drain region (not shown), an upper portion of the channel layer 430 functions as a fourth source/drain region (not shown), and a portion of the channel layer 430 between the third and fourth source/drain regions may function as a channel region (not shown).

In the example embodiments, the channel layer 430 may include an oxide semiconductor, and for example, the oxide semiconductors may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or a combination thereof. The channel layer 430 may include a single layer or multi-layers of the oxide semiconductor. In some embodiments, the channel layer 430 may have a bandgap energy greater than a bandgap energy of silicon. For example, the channel layer 430 may have a bandgap energy of about 1.5 eV to 5.6 eV. For example, the channel layer 430 may have optimum channel performance when it has a bandgap energy of about 2.0 eV to 4.0 eV. For example, the channel layer 430 may be, but is not limited to, polycrystalline or amorphous. In the example embodiments, the channel layer 430 may include graphene, carbon nanotube or a combination thereof.

The second gate electrode 440 may extend in the first direction D1 on both side walls of the channel layer 430. The second gate electrode 440 may include a first sub-gate electrode 440P1 facing the first side wall of the channel layer 430, and a second sub-gate electrode 440P2 facing the second side wall opposite to the first side wall of the channel layer 430. As a single channel layer 430 is placed between the first sub-gate electrode 440P1 and the second sub-gate electrode 440P2, the semiconductor device may have a dual gate transistor structure. However, embodiments of the inventive concept are not limited thereto. The second sub-gate electrode 440P2 is omitted, and only the first sub-gate electrode 440P1 facing the first side wall of the channel layer 430 may be formed to implement a single gate transistor structure. The material included in the second gate electrode 440 may be the same as the material of the first gate electrode 312.

The fourth gate insulating film 450 borders or surrounds the side walls of the channel layer 430 and may be interposed between the channel layer 430 and the second gate electrode 440. For example, as shown in FIG. 11, the entire side wall of the channel layer 430 may be bordered or surrounded by the fourth gate insulating film 450, and a part of the side walls of the second gate electrode 440 may come into physical contact with the fourth gate insulating film 450. In other embodiments, the fourth gate insulating film 450 extends in an extension direction (that is, the first direction D1) of the second gate electrode 440, and among the side walls of the channel layer 430, only the two side walls facing the second gate electrode 440 may come into physical contact with the fourth gate insulating film 450. In the example embodiments, the fourth gate insulating film 450 may be made up of a silicon oxide film, a silicon oxynitride film, a high dielectric constant material having a higher dielectric constant than the silicon oxide film, or a combination thereof.

A plurality of second insulating patterns 432 may extend on the plurality of first insulating patterns 422 along the second direction D2. The channel layer 430 may be placed between the two adjacent second insulating patterns 432 among the plurality of second insulating patterns 432. Further, a first buried layer 434 and a second buried layer 436 may be placed in the space between the two adjacent channel layers 430, between the two adjacent second insulating patterns 432. The first buried layer 434 may be placed at the bottom portion of the space between the two adjacent channel layers 430. The second buried layer 436 may be formed on the first buried layer 434 to be in and at least partially fill the rest of the space between the two adjacent channel layers 430. The upper face of the second buried layer 436 is placed at the same level as the upper face of the channel layer 430 in the cross-sectional view of FIG. 13, and the second buried layer 436 may be on and at least partially cover the upper face of the second gate electrode 440. In other embodiments, a plurality of second insulating patterns 432 is formed of a material layer continuous with a plurality of first insulating patterns 422, or the second buried layer 436 may also be formed of a material layer continuous with the first buried layer 434.

A capacitor contact 460 may be placed on the channel layer 430. The capacitor contact 460 is placed to vertically overlap the channel layer 430, and may be arranged in a matrix form that is spaced apart in the first direction D1 and the second direction D2. The capacitor contact 460 may be made up of, but is not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof. The upper insulating layer 462 may border or surround the side walls of the capacitor contact 460 on the plurality of second insulating patterns 432 and the second buried layer 436.

An etching stop film 470 may be placed on the upper insulating layer 462. A second capacitor 480 may be placed on the etching stop film 470. The second capacitor 480 may include a second lower electrode 482, a second capacitor dielectric film 484 and a second upper electrode 486. The second lower electrode 482 may penetrate the etching stop film 470 and be electrically connected to the upper face of the capacitor contact 460. The second lower electrode 482 may be formed, but is not limited to, in a pillar type extending in the fourth direction D4. In the example embodiments, the second lower electrode 482 is placed to vertically overlap the capacitor contact 460, and may be arranged in a matrix form spaced apart in the first direction D1 and the second direction D2. In other embodiments, a landing pad (not shown) may be further placed between the capacitor contact 460 and the second lower electrode 482, and the second lower electrode 482 may be arranged in a hexagonal shape.

Figure 14:
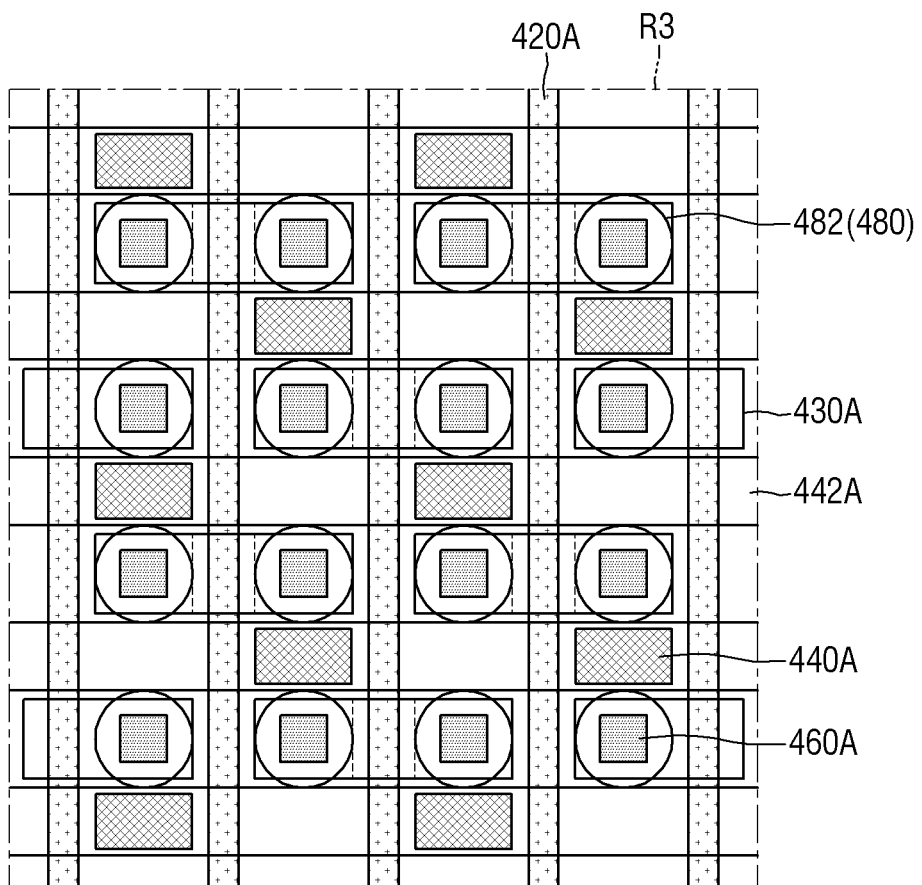
FIG. 14 is a layout diagram that illustrates the semiconductor device according to some embodiments of the inventive concept.
Figure 14:
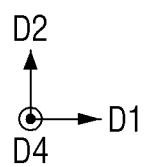
Figure 15:
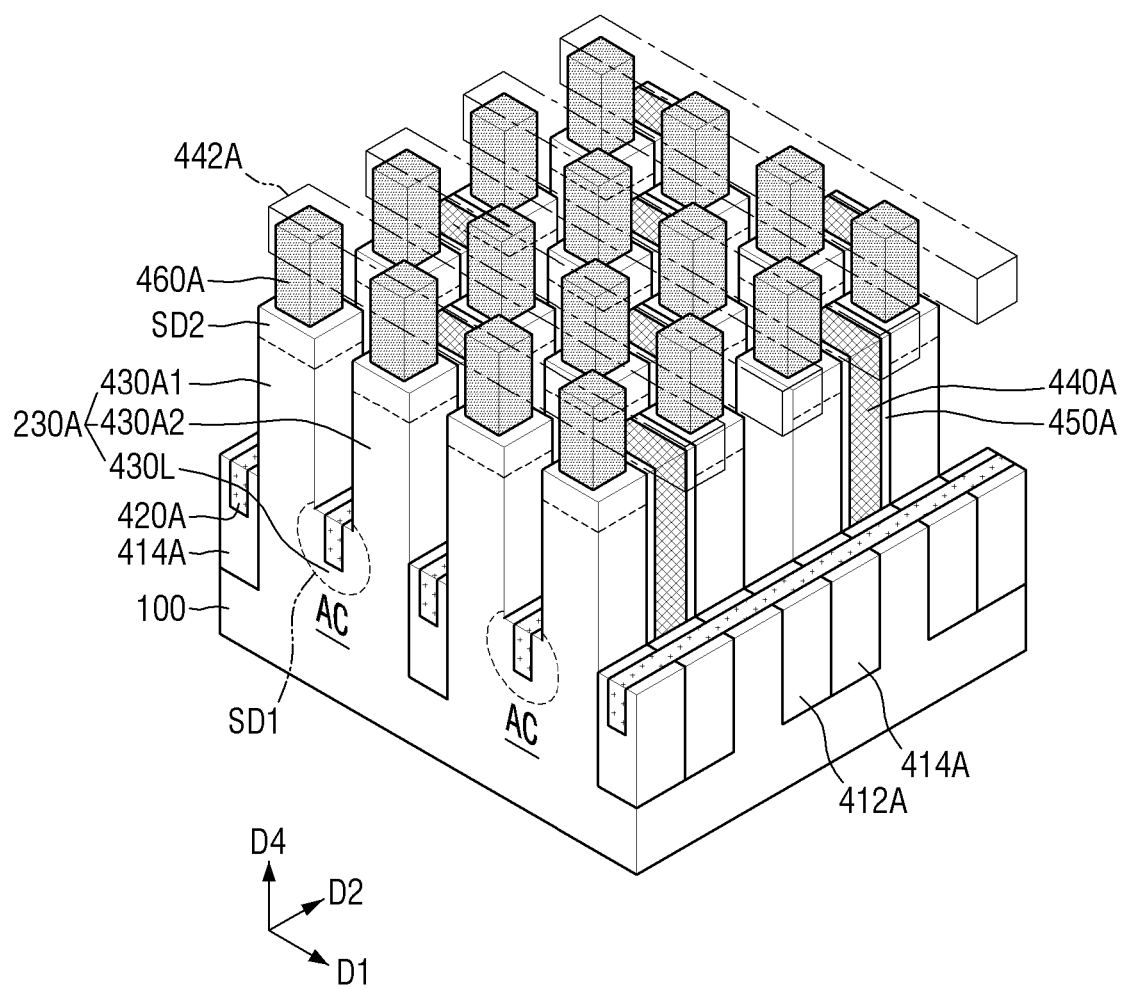
FIG. 15 is a perspective view that illustrates the semiconductor device according to some embodiments of the inventive concept.

FIG. 14 is a layout diagram that illustrates the semiconductor device according to some embodiments of the inventive concept. FIG. 15 is a perspective view that illustrates the semiconductor device according to some embodiments.

Referring to FIGS. 14 and 15, the semiconductor device according to some embodiments may include a substrate 100, a plurality of first conductive lines 420A, a channel structure 430A, a contact gate electrode 440A, a plurality of second conductive lines 442A and a second capacitor 480. The semiconductor device according to some embodiments may be a memory device including a vertical channel transistor VCT.

A plurality of second active regions AC may be defined on the substrate 100 by the first element isolation pattern 412A and the second element isolation pattern 414A. The channel structure 430A may be placed inside each second active region AC. The channel structure 430A may include a first active pillar 430A1 and a second active pillar 430A2 that extend vertically, and a connecting portion 430L connected to the bottom portion of the first active pillar 430A1 and the bottom portion of the second active pillar 430A2, respectively. A fifth source/drain region SD1 may be placed inside the connecting portion 430L. A sixth source/drain region SD2 may be placed on the top side of the first and second active pillars 430A1 and 430A2. Each of the first active pillar 430A1 and the second active pillar 430A2 may form an independent unit memory cell.

The plurality of first conductive lines 420A may extend in a direction intersecting each of the plurality of second active regions AC, and may extend, for example, in the second direction D2. One first conductive line 420A of the plurality of first conductive lines 420A may be placed on the connecting portion 430L between the first active pillar 430A1 and the second active pillar 430A2. One first conductive line 420A may be placed on the fifth source/drain region SD1. Another first conductive line 420A adjacent to one first conductive line 420A may be placed between the two channel structures 430A. One first conductive line 420A of the plurality of first conductive lines 420A may function as a common bit line included in two unit memory cells constituted by the first active pillar 430A1 and the second active pillar 430A2 placed on both sides of one first conductive line 420A.

One contact gate electrode 440A may be placed between the two channel structures 430A adjacent to each other in the second direction D2. For example, a contact gate electrode 440A may be placed between the first active pillar 430A1 included in one channel structure 430A and the second active pillar 430A2 of the channel structure 430A adjacent thereto. One contact gate electrode 440A may be shared by the first active pillar 430A1 and the second active pillar 430A2 placed on both side walls thereof. A fourth gate insulating film 450A may be placed between the contact gate electrode 440A and the first active pillar 430A1, and between the contact gate electrode 440A and the second active pillar 430A2. The plurality of second conductive lines 442A may extend on the upper face of the contact gate electrode 440A in the first direction D1. The plurality of second conductive lines 442A may function as word lines of the semiconductor device.

A capacitor contact 460A may be placed on the channel structure 430A. The capacitor contact 460A may be placed on the sixth source/drain region SD2, and a second capacitor 480 may be placed on the capacitor contact 460A.

Figure 16:
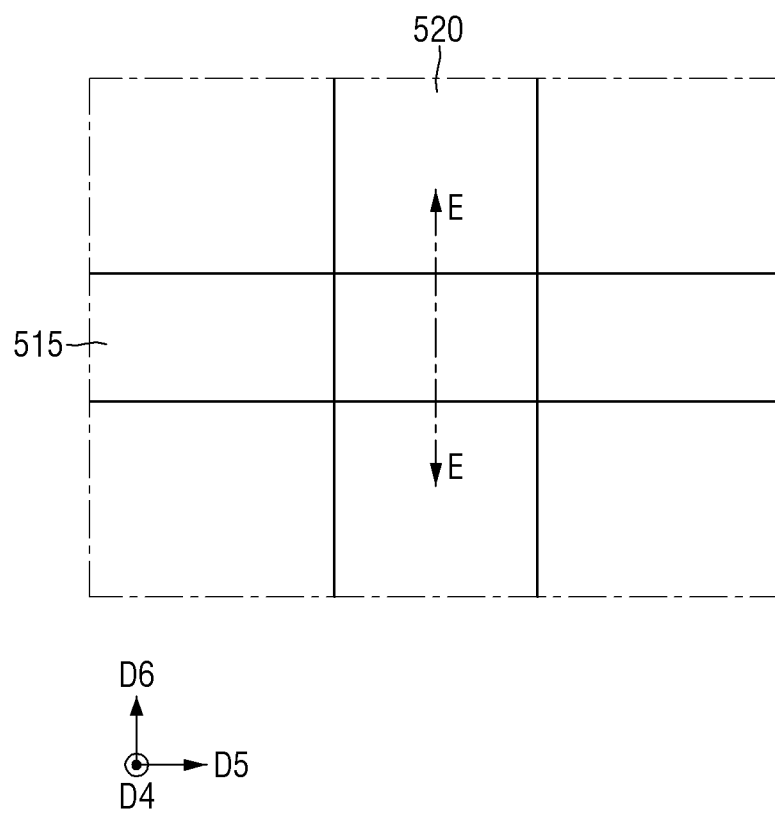
FIGS. 16 and 17 are diagrams that illustrate the semiconductor device according to some embodiments of the inventive concept.
Figure 17:
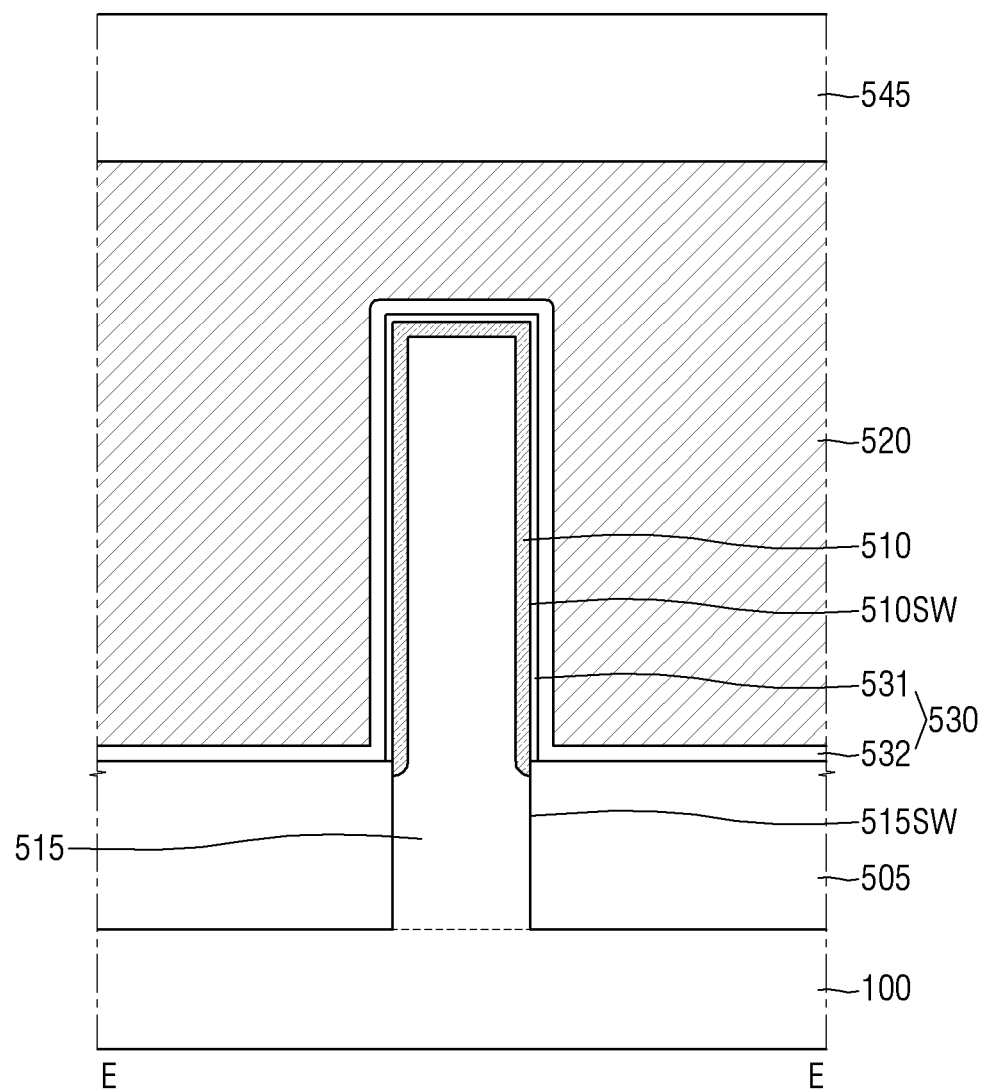

FIGS. 16 and 17 are diagrams that illustrate a semiconductor device according to some embodiments of the inventive concept. FIG. 16 is a layout diagram that illustrates the semiconductor device according to some embodiments of the inventive concept. FIG. 17 is a cross-sectional view taken along E-E of FIG. 16. For reference, FIG. 17 may show a fin-type transistor (FinFET).

Referring to FIGS. 16 and 17, the semiconductor device according to some embodiments may include a multi-channel active pattern 515, a third silicon-germanium film 510, a third gate electrode 520 and a fifth gate insulating film 530.

The multi-channel active pattern 515 may be formed on the substrate 100. The multi-channel active pattern 515 may protrude from the substrate 100. The multi-channel active pattern 515 may extend long in a fifth direction D5. In the semiconductor device according to some embodiments, the multi-channel active pattern 515 may be a silicon fin type pattern.

A field insulating film 505 may be placed on the substrate 100. The field insulating film 505 may be on and cover a part of side walls 515SW of the multi-channel active pattern. The multi-channel active pattern 515 may protrude upward from the upper face of the field insulating film 505. The field insulating film 505 includes an insulating material.

The third silicon-germanium film 510 may be formed on the side walls 515SW of the multi-channel active pattern protruding upward from the upper face of the field insulating film 505. The third silicon-germanium film 510 may be formed conformally along the profile of the multi-channel active pattern 515 protruding upward from the upper face of the field insulating film 505. A part of the third silicon-germanium film 510 may be at least partially covered with the field insulating film 505. The third silicon-germanium film 510 may be formed of a silicon germanium film. For example, the third silicon-germanium film 510 may include a single crystal silicon germanium film.

The fifth gate insulating film 530 may be formed on the third silicon-germanium film 510. The fifth gate insulating film 530 may extend along the profile of the third silicon-germanium film 510 and the upper face of the field insulating film 505. The fifth gate insulating film 530 may include a third interfacial film 531 and a third high dielectric constant insulating film 532, which are sequentially placed on the third silicon-germanium film 510. Although the third interfacial film 531 is shown as being formed on the third silicon-germanium film 510 and as not being not formed on the upper face of the field insulating film 505, the embodiments of the inventive concept are not limited thereto. The germanium fraction of the third silicon-germanium film 510 decreases with increasing distance from the fifth gate insulating film 530.

For example, a semiconductor fin-type pattern including the third silicon-germanium film 510 and the multi-channel active pattern 515 may be divided into upper and lower parts, on the basis of the upper face of the field insulating film 505. The third silicon-germanium film 510 is not formed on the multi-channel active pattern 515 through the deposition process. As a result, on the upper face of the field insulating film 505, the width of the upper part of the semiconductor fin type patterns 510 and 515 in a sixth direction D6 may be the same as or smaller than a width the lower part of the semiconductor fin type patterns 510 and 515 in the sixth direction D6.

The third silicon-germanium film 510 may include a side wall 510SW facing the fifth gate insulating film 530. As an example, when the width of the upper part of the semiconductor fin type patterns 510 and 515 in the sixth direction D6 is the same as the width of the lower part of the semiconductor fin type patterns 510 and 515 in the sixth direction D6, the side wall 510SW of the third silicon-germanium film may be aligned with the side wall 515SW of the multi-channel active pattern.

In other embodiments, when the width of the upper part of the semiconductor fin type patterns 510 and 515 in the sixth direction D6 is smaller than the width of the lower part of the semiconductor fin type patterns 510 and 515 in the sixth direction D6, the side wall 510SW of the third silicon-germanium film may not be aligned with the side wall 515SW of the multi-channel active pattern.

The third gate electrode 520 may be placed on the fifth gate insulating film 530. The third gate electrode 520 may extend in the sixth direction D6. The fifth direction D5 may intersect the sixth direction D6. The third gate electrode 520 may include a metallic conductive material. The third gate mask pattern 545 may be placed on the third gate electrode 520. The third gate mask pattern 545 includes an insulating material.

Figure 18:
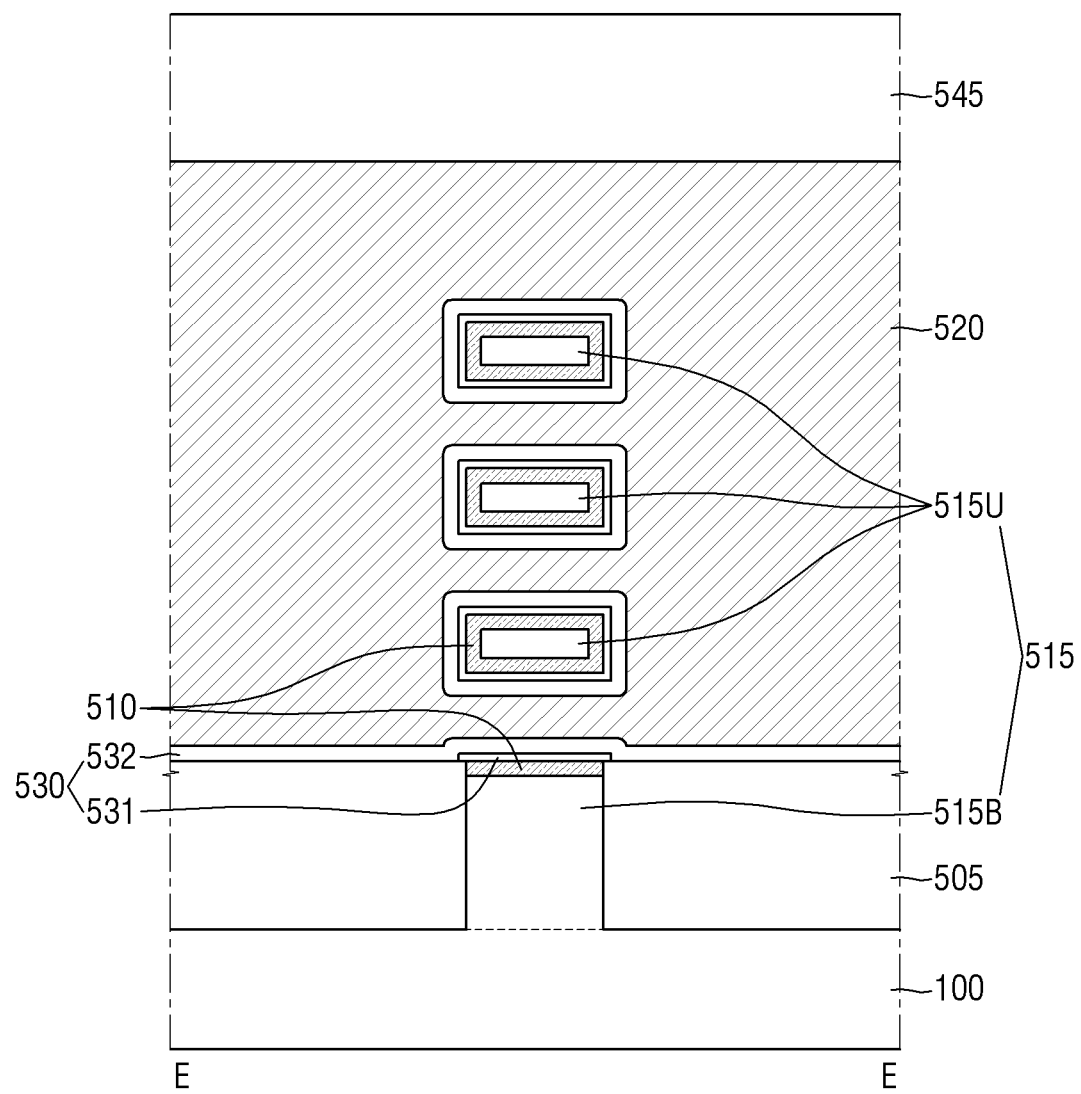
FIG. 18 is a diagram that illustrates the semiconductor device according to some embodiments of the inventive concept.

FIG. 18 is a diagram that illustrates a semiconductor device according to some embodiments of the inventive concept. For convenience of description, feature differences from those described with reference to FIGS. 16 and 17 will be described. FIG. 18 illustrates a transistor including nanowires or nanosheets according to some embodiments.

Referring to FIG. 18, in the semiconductor device according to some embodiments, the multi-channel active pattern 515 may include a lower active pattern 515B and an upper active pattern 515U.

The field insulating film 505 may be on and cover at least a part of the side wall of the lower active pattern 515B. The upper active pattern 515U may be spaced apart from the lower active pattern 515B in the fourth direction (D4 of FIG. 16). Each upper active pattern 515U may also be spaced apart from each other in the fourth direction D4. The upper active pattern 515U and the lower active pattern 515B include silicon.

The third silicon-germanium film 510 may be placed along the upper face of the lower active pattern 515B and the periphery of the upper active pattern 515U.

The fifth gate insulating film 530 may at least partially wrap the upper active pattern 515U. The third gate electrode 520 may at least partially wrap the upper active pattern 515U.

FIGS. 19 to 24 are intermediate stage diagrams that illustrate a method of fabricating the semiconductor device according to some embodiments of the inventive concept.

Figure 19:
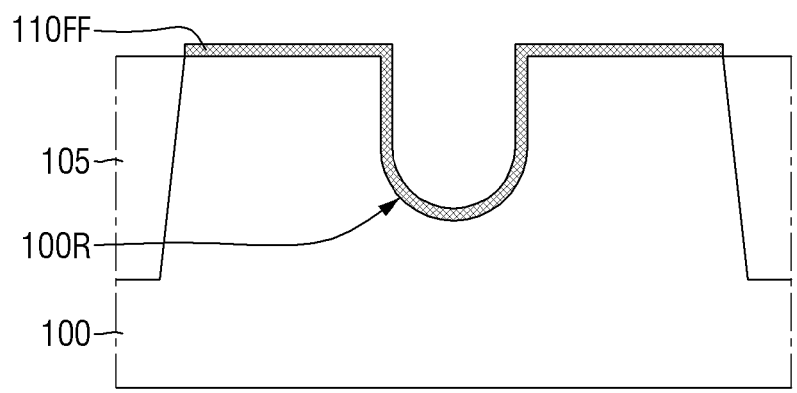
FIGS. 19 to 24 are intermediate stage diagrams that illustrate a method of fabricating the semiconductor device according to some embodiments of the inventive concept.

Referring to FIG. 19, a gate recess 100R may be formed inside the substrate 100. For example, the substrate 100 may be a silicon substrate.

A germanium feed film 110FF may be formed on the substrate 100. The germanium feed film 110FF may be formed along the upper side or surface of the substrate 100 and the profile of the gate recess 100R. The germanium feed film 110FF may include germanium. The germanium feed film 110FF may include at least one of a silicon germanium film or a germanium film. The germanium feed film 110FF may be formed using, for example, a chemical vapor deposition (CVD) or an atomic layer deposition (ALD). Although the germanium feed film 110FF is shown as not being formed on the first element isolation film 105, the embodiments are not limited thereto.

The germanium feed film 110FF may have, for example, but is not limited to, a thickness between 5 nm and 50 nm. The germanium fraction of the germanium feed film 110FF may be, but is not limited to, 30% or more and 100% or less.

Figure 20:
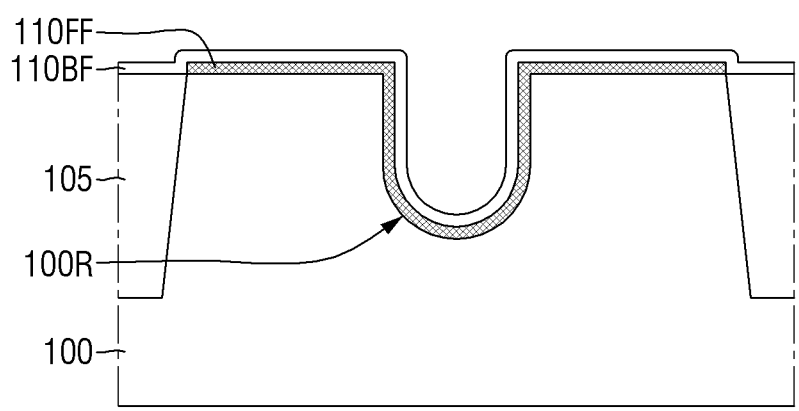

Referring to FIG. 20, a blocking film 110BF may be formed on the germanium feed film 110FF. The blocking film 110BF may be formed along the profile of the germanium feed film 110FF. The blocking film 110BF may extend along the upper face of the first element isolation film 105.

The blocking film 110BF may prevent germanium of the germanium feed film 110FF from being diffused in a direction away from the substrate 100 in a subsequent heat treatment process. The blocking film 110BF may include an insulating material, for example, at least one of a silicon oxide film and/or a silicon nitride film.

Figure 21:
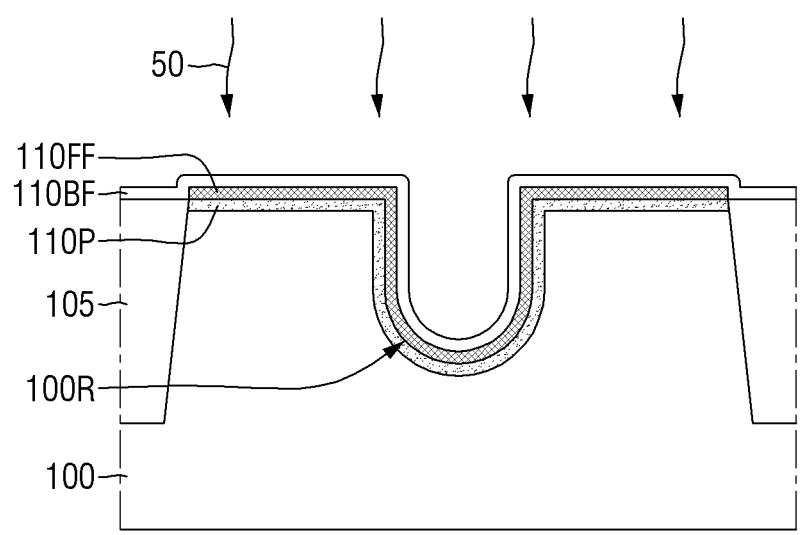

Referring to FIG. 21, germanium in the germanium feed film 110FF may be diffused into the substrate 100 through a first heat treatment process 50. As a result, a pre silicon-germanium film 110P may be formed in the substrate 100.

While the first heat treatment process 50 is being performed, germanium in the germanium feed film 110FF may be diffused uniformly into the substrate 100, regardless of a plane index of the substrate 100. That is, while the first heat treatment process 50 is being performed, germanium in the germanium feed film 110FF may be diffused isotropically into the substrate 100. The pre silicon-germanium film 110P can be formed conformally inside the substrate 100a, accordingly.

Because the pre silicon-germanium film 110P is formed by germanium diffused from the germanium feed film 110FF, the germanium fraction of the pre silicon-germanium film 110P is less than the germanium fraction of the germanium feed film 110FF.

The blocking film 110BF is for reducing or preventing out-diffusion of germanium in the germanium feed film 110FF in the direction away from the substrate 100. That is, when the first heat treatment process 50 is performed at a heat treatment temperature at which out-diffusion of germanium does not matter, the first heat treatment process 50 may be performed in a state in which the blocking film 110BF is not formed.

Figure 22:
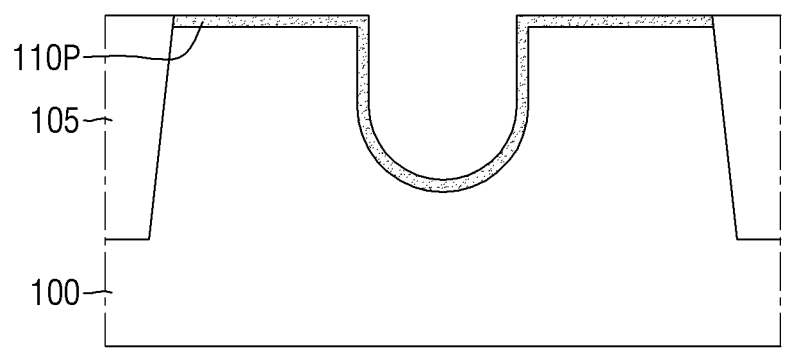

Referring to FIG. 22, the blocking film 110BF and the germanium feed film 110FF may be sequentially removed. The germanium fraction of the germanium feed film 110FF is greater than the germanium fraction of the pre silicon-germanium film 110P. That is, the pre silicon-germanium film 110P may have an etching selectivity different from that of the germanium feed film 110FF due to a difference in the germanium fraction. The germanium feed film 110FF may be removed using a process having an etching selectivity according to a difference in germanium fraction.

Figure 23:
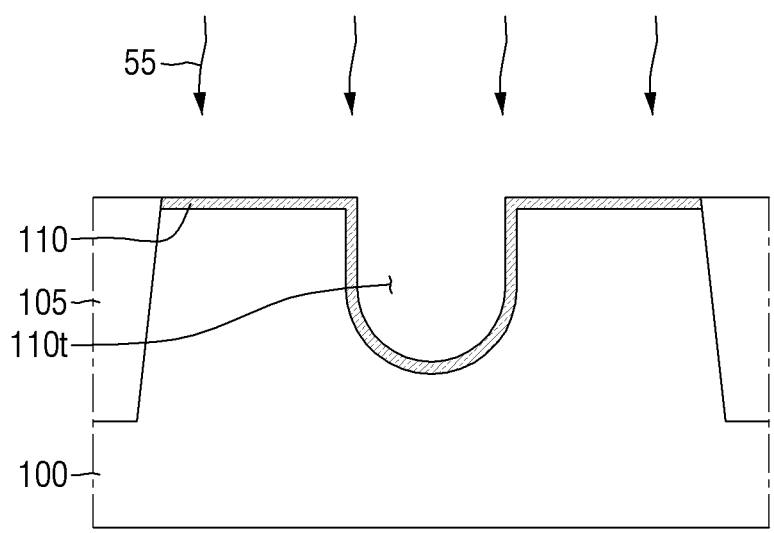

Referring to FIG. 23, the pre silicon-germanium film 110P may be recrystallized through a second heat treatment process 55. As a result, a first silicon-germanium film 110 may be formed. The first silicon-germanium film 110 may define the first gate trench 110t.

A first time during which the second heat treatment process 55 is performed is shorter than a second time during which the first heat treatment process 50 is performed. The second heat treatment process 55 is performed in a shorter time than the first heat treatment process 50 to prevent germanium of the pre silicon-germanium film 110P from being diffused.

Figure 24:
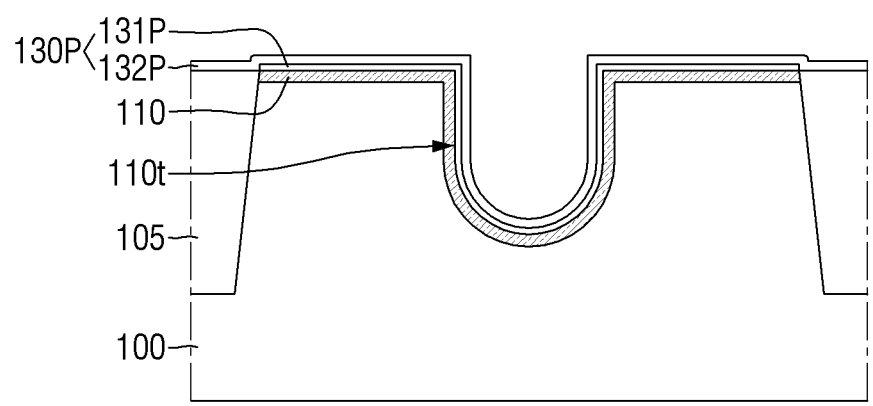

Referring to FIG. 24, a pre gate insulating film 130P may be formed on the first silicon-germanium film 110. The pre gate insulating film 130P may include a pre interfacial film 131P and a pre high dielectric constant insulating film 132P.

Subsequently, a gate electrode stack film may be formed on the pre gate insulating film 130P. The gate electrode stack film and the pre gate insulating film 130P may be patterned to form the first gate insulating film 130 and the first gate electrode stack 120 on the substrate 100.

Figure 25:
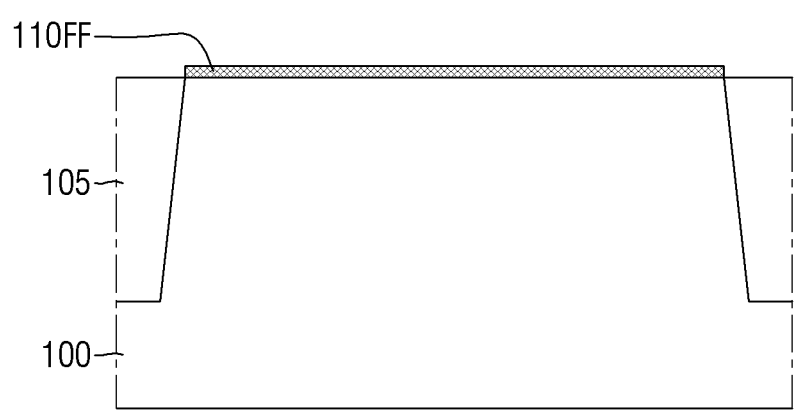
FIGS. 25 to 27 are intermediate stage diagrams that illustrate the method of fabricating the semiconductor device according to some embodiments of the inventive concept.
Figure 26:
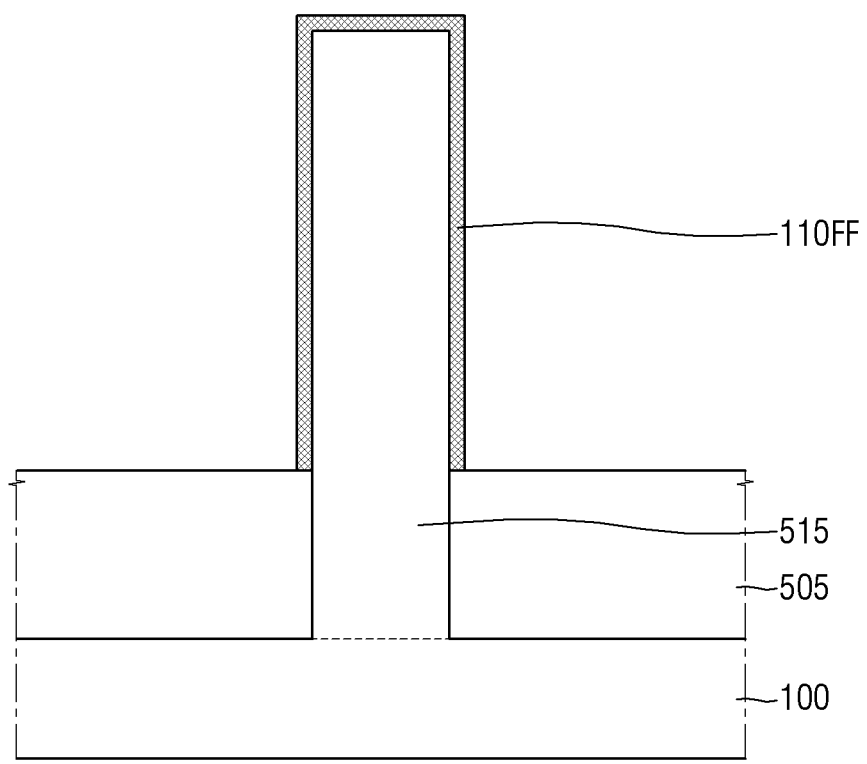
Figure 27:
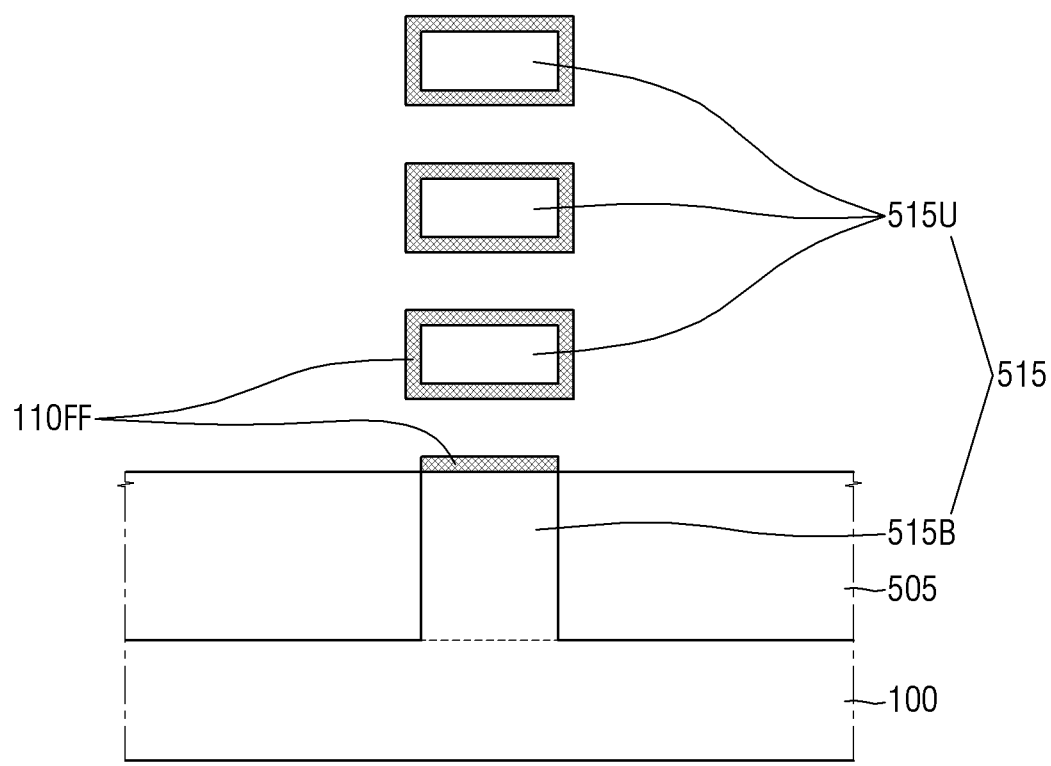

FIGS. 25 to 27 are intermediate stage diagrams that illustrate a method of fabricating the semiconductor device according to some embodiments of the inventive concept, respectively. For reference, each of FIGS. 25 to 27 may be representative of a process performed before FIG. 20.

Referring to FIG. 25, the substrate 100 does not include the gate recess 100R. The germanium feed film 110FF may be formed on the upper side or surface of a flat substrate 100.

Referring to FIG. 26, a multi-channel active pattern 515, which is a protruding structure, is formed on the substrate 100. A field insulating film 505, which partially covers a part of the side walls of the multi-channel active pattern 515, is formed on the substrate 100. The germanium feed film 110FF is formed along the profile of the multi-channel active pattern 515 that protrudes beyond the field insulating film 505.

Referring to FIG. 27, a multi-channel active pattern 515 including the lower active pattern 515B and the upper active pattern 515U is formed on the substrate 100. The germanium feed film 110FF may be formed along the upper face of the lower active pattern 515B and the periphery of the upper active pattern 515U.

Next, a silicon-germanium film is formed through the first heat treatment process (50 of FIG. 21) and the second heat treatment process (55 of FIG. 23).

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
   a substrate including a first region, a second region and a third region, the first region and the second region around the third region;
   a first gate electrode on the first region of the substrate, the first gate electrode including a first lower metallic pattern that includes titanium nitride (TiN), and a gate spacer that is on a side surface of the first lower metallic pattern;
   a silicon-germanium film between the first region of the substrate and the first gate electrode;
   a first gate insulating film between the silicon-germanium film and the first gate electrode;
   a second gate electrode on the second region of the substrate, the second gate electrode including a second lower metallic pattern that includes titanium nitride (TiN);
   a second gate insulating film between the second region of the substrate and the second gate electrode; and
   a third gate electrode in the third region of the substrate, the third gate electrode fully buried in the substrate and being a titanium nitride (TiN)-gate electrode,
   wherein each of the first gate insulating film and the second gate insulating film includes a high dielectric constant film including hafnium and silicon, and the silicon-germanium film contacts a bottom surface of the gate spacer of the first gate electrode.

2. The semiconductor device of claim 1, wherein each of the first gate insulating film and the second gate insulating film includes a silicon oxide film.

3. The semiconductor device of claim 1, wherein the third gate electrode includes doped polysilicon.

4. The semiconductor device of claim 1, further comprises a bit line that is on the third region of the substrate,
   wherein the bit line includes at least one of doped polysilicon, titanium nitride (TiN), titanium silicon nitride (TSN), or tungsten (W).

5. The semiconductor device of claim 1, further comprises a source/drain region that is at a side of the first gate electrode and is in the first region of the substrate,
   wherein the silicon-germanium film is on the source/drain region.

6. The semiconductor device of claim 1, further comprising:
   a first source/drain region is at a first side of the first gate electrode and is in the first region of the substrate; and
   a second source/drain region is at a second side of the first gate electrode that is opposite to the first side of the first gate electrode, and is in the first region of the substrate,
   wherein the silicon-germanium film is between the first source/drain region and the second source/drain region, and is on the first region of the substrate.

7. The semiconductor device of claim 1, wherein the first gate insulating film includes a silicon oxide film between the silicon-germanium film and the high dielectric constant film of the first gate insulating film, and
   the silicon oxide film is on the silicon-germanium film.

8. The semiconductor device of claim 1, wherein the first lower metallic pattern of the first gate electrode is on the silicon-germanium film, and
   the first gate electrode includes a first semiconductor pattern on the first lower metallic pattern, and a first upper metallic pattern on the first semiconductor pattern.

9. The semiconductor device of claim 8, wherein the first semiconductor pattern of the first gate electrode includes doped polysilicon, and
   the first upper metallic pattern of the first gate electrode includes at least one of titanium nitride (TiN), titanium silicon nitride (TSN), or tungsten (W).

10. The semiconductor device of claim 1, wherein the second lower metallic pattern of the second gate electrode is on the second gate insulating film, and
    the second gate electrode includes a second semiconductor pattern on the second lower metallic pattern, and a second upper metallic pattern on the second semiconductor pattern.

11. The semiconductor device of claim 10, wherein the second semiconductor pattern of the second gate electrode includes doped polysilicon, and
    the second upper metallic pattern of the second gate electrode includes at least one of titanium nitride (TiN), titanium silicon nitride (TSN), or tungsten (W).

12. The semiconductor device of claim 1, wherein the high dielectric constant film of the first gate insulating film includes aluminum.

13. The semiconductor device of claim 1, wherein the high dielectric constant film of the second gate insulating film includes lanthanum.

14. A semiconductor device comprising:
a substrate including a first peri-region, a second peri-region and a cell region, the first peri-region and the second peri-region around the cell region;
a first gate electrode on the first peri-region of the substrate, the first gate electrode including a first lower metallic pattern, a first upper metallic pattern, and a first semiconductor pattern between the first lower metallic pattern and the first upper metallic pattern;
a gate spacer that is on a side surface of the first gate electrode;
a first gate insulating film between the first peri-region of the substrate and the first gate electrode, the first gate insulating film including a first silicon oxide film and a first high dielectric constant film on the first silicon oxide film;
a second gate electrode on the second peri-region of the substrate, the second gate electrode including a second lower metallic pattern, a second upper metallic pattern and a second semiconductor pattern between the second lower metallic pattern and the second upper metallic pattern;
a second gate insulating film between the second peri-region of the substrate and the second gate electrode, the second gate insulating film including a second silicon oxide film and a second high dielectric constant film on the second silicon oxide film;
a titanium nitride (TiN)-cell gate electrode arranged in the cell region of the substrate and fully buried in the substrate; and
a bit line on the cell region of the substrate,
wherein the first high dielectric constant film of the first gate insulating film includes hafnium, aluminum, silicon and oxygen, and
the second high dielectric constant film of the second gate insulating film includes hafnium, silicon and oxygen.

15. The semiconductor device of claim 14, further comprises a silicon-germanium film between the first peri-region of the substrate and the first gate electrode, wherein the silicon-germanium film contacts a bottom surface of the gate spacer of the first gate electrode.

16. The semiconductor device of claim 14, wherein the first lower metallic pattern of the first gate electrode includes titanium nitride (TiN),
the first upper metallic pattern of the first gate electrode includes titanium nitride (TiN) and tungsten (W),
the first semiconductor pattern of the first gate electrode includes doped polysilicon,
the second lower metallic pattern of the second gate electrode includes titanium nitride (TiN),
the second upper metallic pattern of the second gate electrode includes titanium nitride (TiN) and tungsten (W), and
the second semiconductor pattern of the second gate electrode includes doped polysilicon.

17. The semiconductor device of claim 14, wherein the second high dielectric constant film of the second gate insulating film includes lanthanum.

18. The semiconductor device of claim 14, wherein the bit line includes at least one of doped polysilicon, titanium nitride (TiN), titanium silicon nitride (TSN), or tungsten (W).

19. The semiconductor device of claim 14, wherein the titanium nitride (TiN)-cell gate electrode includes doped polysilicon.

20. The semiconductor device of claim 15, wherein the first lower metallic pattern of the first gate electrode includes titanium nitride (TiN),
the first upper metallic pattern of the first gate electrode includes titanium silicon nitride (TSN) and tungsten (W),
the first semiconductor pattern includes doped polysilicon, and
the first silicon oxide film is on the silicon-germanium film.

* * * * *